(12) United States Patent
de Jong et al.

(10) Patent No.: US 10,012,806 B2
(45) Date of Patent: *Jul. 3, 2018

(54) METHODS OF FORMING A FIBER COUPLING DEVICE AND FIBER COUPLING DEVICE

(71) Applicant: CCS Technology, Inc., Wilmington, DE (US)

(72) Inventors: Michael de Jong, Colleyville, TX (US); Davide Domenico Fortusini, Ithaca, NY (US); Andreas Matiss, Berlin (DE); Martin Spreemann, Berlin (DE); Eric Stephan ten Have, Berlin (DE)

(73) Assignee: Corning Optical Communications LLC, Hickory, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/242,946

(22) Filed: Aug. 22, 2016

(65) Prior Publication Data

US 2016/0356971 A1    Dec. 8, 2016

Related U.S. Application Data

(63) Continuation of application No. PCT/US2015/018575, filed on Mar. 4, 2015.

(30) Foreign Application Priority Data

Mar. 5, 2014    (EP) .................................... 14157912

(51) Int. Cl.
*G02B 6/42* (2006.01)
*G02B 6/43* (2006.01)
(Continued)

(52) U.S. Cl.
CPC .......... *G02B 6/4214* (2013.01); *B29C 64/135* (2017.08); *B29C 64/35* (2017.08);
(Continued)

(58) Field of Classification Search
None
See application file for complete search history.

(56) References Cited

U.S. PATENT DOCUMENTS

| 5,148,322 A | 9/1992 | Aoyama et al. |
| 5,369,529 A | 11/1994 | Kuo et al. |

(Continued)

FOREIGN PATENT DOCUMENTS

| DE | 102010018248 | * 10/2011 | ............. H01L 33/58 |
| DE | 102010018248 A1 | * 10/2011 | ............. H01L 33/58 |

(Continued)

OTHER PUBLICATIONS

Koos et al "Photonic wire bonding: An enabling technology for heterogeneous multi-chip integration," in Advanced Photonics 2013, OSA Technical Digest (online) (Optical Society of America, 2013), paper IM4A.3.

(Continued)

*Primary Examiner* — Michelle R Connelly
(74) *Attorney, Agent, or Firm* — Michael E. Carroll, Jr.

(57) ABSTRACT

The application provides methods of forming a fiber coupling device comprising a substrate, the substrate having a substrate surface and at least one optoelectronic and/or photonic element, and further comprising at least one fiber coupling alignment structure that is optically transmissive. One method comprises a) applying a polymerizable material to the substrate surface, b) selectively polymerizing, using a method of 3D lithography, a region of the polymerizable material so as to convert the region of the polymerizable material into a polymer material, thereby forming at least (Continued)

one fiber coupling alignment structure, and c) cleaning the substrate and the polymer material from remaining non-polymerized polymerizable material, thereby exposing the at least one fiber coupling alignment structure of the fiber coupling device.

53 Claims, 14 Drawing Sheets

(51) Int. Cl.
| | |
|---|---|
| B33Y 10/00 | (2015.01) |
| B33Y 40/00 | (2015.01) |
| B33Y 80/00 | (2015.01) |
| G02B 6/138 | (2006.01) |
| B29C 64/135 | (2017.01) |
| B29C 64/35 | (2017.01) |
| B23K 103/00 | (2006.01) |
| B29K 105/00 | (2006.01) |
| B29L 31/36 | (2006.01) |

(52) U.S. Cl.
CPC .............. B33Y 10/00 (2014.12); B33Y 40/00 (2014.12); B33Y 80/00 (2014.12); G02B 6/138 (2013.01); G02B 6/424 (2013.01); G02B 6/425 (2013.01); G02B 6/4221 (2013.01); G02B 6/4243 (2013.01); G02B 6/4257 (2013.01); *B23K 2203/42* (2015.10); *B23K 2203/50* (2015.10); *B29K 2105/0058* (2013.01); *B29L 2031/36* (2013.01); *G02B 6/4239* (2013.01)

(56) References Cited

U.S. PATENT DOCUMENTS

| | | | |
|---|---|---|---|
| 6,291,139 B1 | 9/2001 | Babine et al. | |
| 6,491,447 B2* | 12/2002 | Aihara | G02B 6/4214 385/89 |
| 6,813,418 B1 | 11/2004 | Kragl | |
| 7,302,127 B1 | 11/2007 | Alameh et al. | |
| 7,303,853 B2* | 12/2007 | Afromowitz | G03F 7/2022 430/270.1 |
| 8,457,454 B1 | 6/2013 | Roy et al. | |
| 8,939,657 B2 | 1/2015 | Hung | |
| 9,213,148 B2 | 12/2015 | Li et al. | |
| 9,310,571 B2 | 4/2016 | Hung | |
| 2001/0050271 A1 | 12/2001 | Matsushima et al. | |
| 2002/0025122 A1 | 2/2002 | Ouchi et al. | |
| 2006/0029331 A1* | 2/2006 | Brenner | G02B 6/4214 385/39 |
| 2009/0136236 A1* | 5/2009 | Glebov | G02B 6/4214 398/139 |
| 2009/0261488 A1 | 10/2009 | Shimizu | |
| 2011/0262081 A1 | 10/2011 | Wohlfeld et al. | |
| 2013/0087690 A1 | 4/2013 | Sloey et al. | |
| 2013/0315530 A1* | 11/2013 | La Porta | G02B 6/138 385/14 |
| 2014/0072311 A1* | 3/2014 | Giziewicz | G02B 6/4214 398/135 |
| 2014/0270659 A1* | 9/2014 | Schunk | G02B 6/4277 385/93 |
| 2015/0301295 A1 | 10/2015 | Smith et al. | |
| 2015/0323748 A1 | 11/2015 | Contag | |
| 2016/0231518 A1* | 8/2016 | Stiles | G02B 6/4214 |
| 2016/0356971 A1 | 12/2016 | de Jong et al. | |

FOREIGN PATENT DOCUMENTS

| | | |
|---|---|---|
| DE | 10201110433 A1 | 12/2012 |
| JP | H01316710 A | 12/1989 |
| JP | 2003023204 A | 1/2003 |
| KR | 1443043 B | 10/2014 |
| WO | WO2012031780 A2 | 3/2012 |
| WO | WO2012069930 A1 | 5/2012 |

OTHER PUBLICATIONS

Lawson et al. "Method of creating microscale prototypes using SLM based holographic lithography" Micromachining and Microfabrication Process Technology XVIII, Proc. of SPIE vol. 8612 (2013) 8 pgs.

Yoshinori Matsumoto et al. "High efficiency optical coupler for a small photo acceptance area photodiode used in the high speed plastic optical fiber communication" Sensors and Actuators A 97-98 (2002) pp. 318-322.

"3D Printer With Nano Precision," Optik & Photonik, 7:29.doi: 10.1002/opph.2012& Photonik, 7:29.doi: 10.1002/opph.201290041, (2012).

Akira Mori et al, "Formation of micro lens by laser polymerization," Electronics and C Electronics and Communications in Japan, Scripta Techna, New York, US, 95:2, pp. 59-67, Feb. 1, 2012.

IPRP issued in PCT Appln. No. PCT/US2015/018578, dated Sep. 2016.

PCT International Search Report for PCT/US2015/018578, dated Aug. 26, 2015.

EP Extended Search Report issued in EP Appln. No. 14157912.8, dated Sep. 9, 2014.

* cited by examiner

METHODS OF FORMING A FIBER COUPLING DEVICE AND FIBER COUPLING DEVICE

PRIORITY APPLICATION

This application is a continuation of International Application No. PCT/US2015/18575, filed on Mar. 4, 2015, which claims the benefit of priority of European Patent Application Serial No. 14157912.8, filed on Mar. 5, 2014, the content of which is relied upon and incorporated herein by reference in their entirety.

BACKGROUND

The application refers to methods of forming a fiber coupling device. The application further refers to a fiber coupling device. Fiber coupling devices comprise a substrate having a substrate surface and at least one optoelectronic and/or photonic element. On the substrate surface and/or the at least one optoelectronic and/or photonic element, at least one fiber coupling alignment structure is arranged which is optically transmissive.

In this application, the term 'fiber coupling device' does not necessarily include the fiber or the fiber endpiece. Rather, a 'fiber coupling device', wherever addressed in the application, shall denote a device or arrangement sufficiently prepared to allow mounting of a fiber endpiece. Generally, fiber mounting can be done either directly after fabrication of the device or arrangement or at a later point in time, depending on the particular construction of the fiber coupling device.

Optical fibers used for transmitting signals by means of electromagnetic radiation with wavelengths in the visible or infrared range have to be coupled, that is properly mounted in a precisely aligned position, relative to optoelectronic or photonic elements of chips or other substrates in order to ensure proper signal transmission with sufficiently high coupling efficiency between the optical fibers and the chips or other substrates. Proper alignment is required for each fiber that is for both ends or endpieces of it, at or near the respective optoelectronic or photonic elements to be connected to, such as optical transmitters, receivers or transceivers. In the case of an optoelectronic rather than photonic element, the element may for instance be a light-detecting or light-emitting optoelectronic element, such as a VCSEL, a laser diode, a photodiode, a photodetector or any other element for emitting or detecting electromagnetic radiation.

Optoelectronic substrates, photonic substrates and photonically integrated substrates (PIC; photonically integrated chip) comprise one or a plurality of optoelectronic elements, or photonic elements, respectively. Optoelectronic substrates may for instance be (or include, arranged on a mounting substrate) semiconductor chips (made of silicon, indium phosphide or any other binary, ternary or quaternary semiconductor material and/or comprising plural layers of these and other materials, for instance), glass substrates, quartz substrates, ceramic substrates or synthetic substrates. Such optoelectronic and/or photonic substrates (hereinafter commonly referred to as 'chips' without further distinction) may be supported by additional mounting substrates, such as printed circuit boards (PCBs). Hereinafter, any arrangement of one or a plurality of chips, be it with or without a mounting substrate underneath, may generally be addressed when a 'substrate' is referred to herein below.

For coupling endpieces of optical fibers to photoelectronic or photonic elements, one or a plurality of fiber coupling alignment structures are required. In the simplest case, when a fiber endpiece is glued, by means of a light-transmissive glue droplet, to an optoelectronic element, precise alignment of the fiber endpiece to the active area of the optoelectronic element is required, which usually involves effort and some monitoring and adjustment of the fiber endpieces's position.

Conventionally, preshaped structures such as shrinked boot parts or preshaped parts molded by injection molding are used as fiber coupling alignment structures. These molding parts have to be mounted in proper alignment with respect to the optoelectronic or photonic elements of the chip or substrate. Any imprecise positioning of a molded fiber coupling alignment structure onto the respective substrate degrades the optical coupling efficiency (which can be actively measured as the percentage of light intensity actually transmitted through the fabricated chip-fiber-connection). Imprecise positioning of a molded fiber coupling alignment structure on the substrate thus reduces the tolerance for any positional mismatch between the fiber and the molded coupling structure itself during fiber assembly. Even if the 'Fiber Coupling Alignment Structure' (or 'FCAS' as subsequently referred to in the specification for the sake of brevity) and its contours (such as the fiber support surface, for instance a groove) were shaped very accurately, the fiber endpiece has still to be glued onto it. Although fiber mounting can be done by exploiting passive, self-aligned optical fiber coupling without the need to actively measure the amount of light intensity actually transmitted, any misalignment between the FCAS and the substrate narrows the tolerance margin left for mounting the fiber to the FCAS.

Many substrates, such as mounting substrates comprising at least one chip mounted thereon, comprise optoelectronic or photonic elements on their top main surface, thus resulting in a propagation direction of light to be emitted or detected which propagation direction is substantially normal to the active area or chip main surface or at least within an angular range of less than ±45°, such as less than ±20° from the normal direction of the active area or main surface. However, when the optical fiber approaches the chip substantially in parallel to its main surface, reflective mirror surfaces or other constructional elements or parts are required in order to reconcile the demands of optimum coupling efficiency and small vertical extension of the fiber-connected substrate. For instance, mirror surfaces with an orientation of about 45° (±5°) with respect to the main surface are often provided at or outside the fiber coupling alignment structure FCAS. If such additional reflecting elements are aligned improperly between the fiber endpiece and the substrate, signal transmission is degraded further. Even if the fiber coupling alignment structure is integrated in the FCAS, for instance as an inclined outer surface portion of it, any mismatch between the FCAS and the substrate causes a reflected light beam, after entering from the fiber, to be offset both in lateral as well as vertical directions, thus being less completely coupled to the optoelectronic or photonic element of the chip or substrate.

It is desirable to provide a method of forming a fiber coupling device and a fiber coupling device that ensure more precise mounting of an optical fiber in improved alignment and with even less manufacturing effort and costs.

SUMMARY

The embodiments disclosed in the detailed description include methods according to claims 1 and 24 of forming a fiber coupling device and further include a fiber coupling device according to claim 31. The methods may further be executed according to any combination of the steps described in the present application, and the fiber coupling device may further be characterized by one or more of the features described herein or known in the art.

BRIEF DESCRIPTION OF THE DRAWINGS

Exemplary embodiments are disclosed herein with respect to the figures.

DETAILED DESCRIPTION

Generally, throughout the application including the figures, the same reference signs are used. Furthermore, any proportions and dimensions depicted in the figures are merely exemplary and not to scale and thus may be varied.

In the application, wherever optical fibers are referred to, this encompasses both fibers destined for transmission of visible light as well as those for transmission of other electromagnetic radiation, particularly infrared or UV. Furthermore, the fibers or optical fibers referred to in the application may include fibers made of glass or of any other material.

Finally, a fiber, wherever addressed in the application, may be a fiber with a coating and/or a cladding; and the outer circumferential surface of the fiber may be the outer circumferential surface of an uncoated fiber; particularly the outer perimeter of a fiber endpiece that is uncoated and/or cleaved, or the outer circumferential surface of the fiber cladding, or of the fiber coating, to be glued to the fiber coupling device, respectively.

Figure 1:
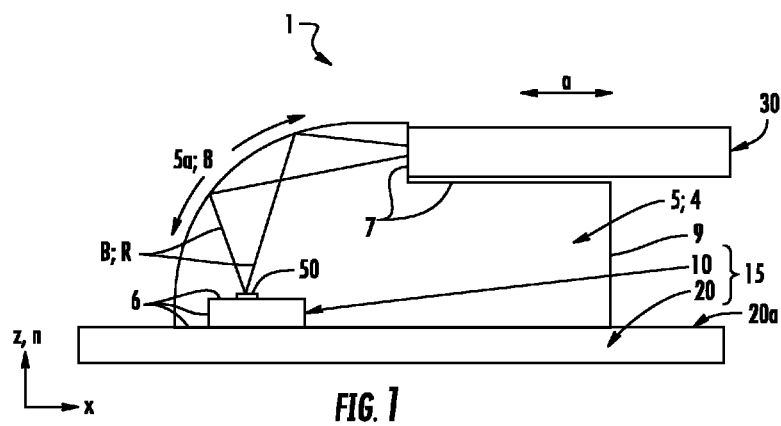
FIG. 1 shows an exemplary embodiment of a fiber coupling device.

FIG. 1 shows an exemplary embodiment of a fiber coupling device 1. The fiber coupling device 1 comprises a substrate 15 with at least one optoelectronic or photonic element 50 and further comprises a fiber coupling alignment structure 5. Accordingly, the fiber coupling device comprises one or plural optoelectronic or photonic elements 50 provided on one or plural optoelectronic or photonic chips 10. Preferably, the fiber coupling device discussed with reference to the figures of the present application comprises a plurality of optoelectronic or photonic chips, each of them comprising a respective optoelectronic or photonic element which is coupled or is to be coupled to a respective optical fiber. An endpiece of an optical fiber 30 is mounted or mountable to each fiber coupling alignment structure 5 (FCAS); the fiber coupling alignment structure 5 being designed such and/or mounted to the substrate 15 such that, upon attachment of the fiber 30 to the fiber coupling alignment structure 5, passive self-alignment of the optical fiber 30 with respect to the optoelectronic or photonic element 50 with high coupling efficiency is obtained. For instance, a coupling surface and/or a fiber coupling surface of the fiber coupling alignment structure 5 may be shaped such as to conform to a fiber end surface (defining the end of the fiber along its axial direction) and/or to a circumferential surface of an optical fiber, thereby enabling gluing of the fiber onto them in a predefined, self-aligned position and/or orientation.

As expressed above, the term 'fiber coupling device' 1 does not necessarily include the optical fiber 30 or its endpiece; rather it denotes a component sufficiently prepared to allow for self-aligned mounting of a fiber with high coupling efficiency, even if the optical fiber 30 still needs to be mounted to it at a later point in time. For linguistic distinction from the fiber coupling device 1 without the optical fiber 30, a 'connected' or 'completed' fiber coupling device which includes the mounted fiber endpiece of at least one optical fiber 30 might be named a 'fiber coupling arrangement'. At least one endpiece of at least one optical fiber 30 is mountable, to the fiber coupling alignment structure 5 of the fiber coupling device 1, using glue or any other adhesive, and particularly mountable to the fiber support region 7 indicated in FIG. 1. Herein below, as mentioned above, the fiber coupling alignment structure 5 will mostly be called 'FCAS' for the sake of brevity.

As depicted in FIG. 1, a substrate 15 may comprise a mounting substrate 20 and one or a plurality of chips 10 of any kind mentioned in the application, for instance. The substrate 15 may comprise at least one optoelectronic or photonic element 50. One or a plurality of optoelectronic or photonic elements 50 may be provided on one chip or on a plurality of chips 10 of the substrate 15. The substrate 15 may, optionally, further comprise a mounting substrate 20 which may be a printed circuit board, for instance. The chip or chips 10 may be microelectronic chips each comprising an integrated circuit, particularly an electronic circuit and/or a microelectronic, which is integrated circuit. The integrated circuit may comprise one or a plurality of electronic and/or photonic elements 50. Such elements 50 may be arranged on a main surface, for instance on the upper top surface as it is the case for the element 50 in FIG. 1. The chip or chips 10 of the embodiments of FIG. 1 or of any other figure or further embodiment of the application may be formed of and/or comprise a semiconductor material or semiconductor material layer.

The chip or chips 10 (or some of them) may also be a photonic chip or photonic chips; with signal transmission in and/or on the chip or chips being implemented by using light propagation rather than electrical currents. Furthermore, each chip 10 constituting or forming part of the substrate 15 may further be a combined optoelectronic and photonic chip, i.e. a Photonically Integrated Chip (PIC). At least one chip 1 comprises both a (microelectronic or electronic) integrated circuit and at least one integrated photonic chip region for photonic signal transmission if desired. In the following, for conciseness an 'optoelectronic and/or photonic chip' 10 is often addressed as a 'chip' 10 and an 'optoelectronic or photonic element' 50 is often just called 'element' 50.

The substrate 15 may be one single chip 10 of sufficiently large size for carrying at least one FCAS 5. Alternatively, the substrate 15 may comprise a plurality of chips 10. In addition to the chip or chips 10, the substrate 15 may represent or may, in addition to the chip or chips, optionally further include a mounting substrate 20 supporting the chip or chips 10. In cases where a single chip 10 constitutes the entire substrate 15, it may extend, along the lateral directions x, y, beyond the lateral extensions of the fiber coupling alignment structure 5 or FCAS, such as both along positive and negative x and y directions, so as to support and surround the entire FCAS 5.

Regardless of the particular example for the substrate 15, the substrate 15 comprises at least one optoelectronic and/or photonic element 50. As shown, at least one element 50 may be provided on the main surface of the chip 10. However, the chip 10 or substrate 15 may comprise a plurality of optoelectronic or photonic elements 50, such as optical emitters, receivers or transceivers, or optoelectronic emitters or receivers. Each chip 10 constituting or forming part of the substrate 15 may further include both optoelectronic elements 50 as well as photonic elements 50 assembled combinedly on one piece of die. It should further be understood that the chip or chips 10 need not comprise a complex integrated circuit. Rather, the element 50 or elements 50 may constitute the main device of the respective chip 10; in which case the chip 10 only serves as a small piece of die or substrate material of sufficient size to accommodate and operate at least one optoelectronic and/or photonic element 50 on it. Lateral dimensions of the chip 10 may for instance be in the range between 50 µm and 10 mm, such as in the range between 0.1 mm and 1 mm. However, the chip or chips 10 may have other suitable dimensions such as much smaller. The lateral dimensions of the FCAS along x and/or y direction may range between 10 µm and 10 mm, such as between 0.1 mm and 1 mm. The FCAS may extend, along one or both lateral directions x and/or y, beyond the lateral extensions of the chip 10. Thus in case of the above numerical values indicating exemplary ranges for conceivable extensions of the chip 10 and of the FCAS 5, the lateral extensions of the FCAS 5 are chosen as desired and may be larger than those of the chip 10.

Furthermore, the lateral extensions of the FCAS 5 may be chosen larger than the numerical values given above, and their lateral extensions may exceed 1 mm or even 10 mm; the FCAS 5 thus additionally covering at least a portion of the main surface of the mounting substrate 20 laterally surrounding and/or adjoining the chip 10. Besides, it is to be noted that also the vertical dimension of the FCAS 5 is chosen larger than the thickness or height of the chip 10. The FCAS may further cover and surround a plurality of chips 10 arranged on the mounting substrate. Alternatively, a plurality of FCAS's 5 might be provided on the mounting substrate, each of them covering at least one chip.

The elements 50 may be optoelectronic elements 50, such as VCSELs (Vertical Cavity Surface-Emitting Lasers), photodiodes, laser diodes, photodetectors or other devices capable of emitting or detecting electromagnetic radiation. They may comprise an active area forming part of the main surface 10a (FIG. 2) of the chip 10 or substrate. The lateral extensions of the element 50 on the main surface, that is the extensions of the active area, may be in the range between 0.1 µm and 100 µm, such as in the range between 1 µm and 40 µm. These and the above numbers for the lateral extensions of the chip 10 and/or of the element 50 may refer to one or to both of the lateral directions x and y. In FIG. 1, the element 50 is visualized by an elevated portion of the upper surface (main surface) of the chip 10. However, in reality no such elevation needs to be present; and in most of the following figures the optoelectronic or photonic element 50 will not be indicated specifically.

In the particular example of a substrate shown in FIG. 1 and in the following figures, the substrate 15 comprises a mounting substrate 20 and one chip 10 or a plurality of chips 10 (which may be optoelectronic chips, photonic chips or photonically integrated chips) on top of it. For conciseness, in the following only optoelectronic chips will be referred to with the understanding that photonic chips or photonically integrated chips are equally addressed, though not mentioned explicitly.

The (optoelectronic) chip may comprise radiation-detecting or radiation-emitting elements 50 of the sorts mentioned earlier above and, optionally, an integrated circuit. However, in addition to or instead of a microelectronic, integrated circuit, the element 50 or number of elements 50 may be the main feature, that is the main component of the chip; thus defining the operational chip function and without any integrated circuitry being needed for operating the element or elements 50. Accordingly, the chip may comprise only one optoelectronic component (VCSEL, photodiode, etc.; see above) or a group or plurality of them. The chip 10 may thus be designed for supporting and operating at least one optoelectronic, photonic or photonically integrated device or devices. Although a particular type of substrate is depicted in FIG. 1 and in the following figures, it is to be noted that any other kind or arrangement of one or plural chips 10, mounting substrates 20 and/or elements 50 may constitute the substrate 15 in the figures.

Referring again to FIG. 1, apart from the substrate 15 with the at least one optoelectronic and/or photonic element 50, the fiber coupling device 1 further comprises the fiber coupling alignment structure 5 or 'FCAS' arranged on it. Particularly, the FCAS 5 is arranged directly on the substrate surface of the substrate 15 and covers at least a surface portion of a substrate main surface. According to the application, the 'FCAS' or fiber coupling alignment structure 5 directly abuts or adjoins the substrate surface, i.e. directly contacts the substrate surface or substrate material of the substrate 15 without any other material such as glue, or adhesive or the like, in between them (glueless connection). The FCAS 5 is made of a polymer, particularly of a laser-solidified polymer which, for instance, may be a polymer obtained by polymerizing a polymerizable material such as a resist material. The polymer material 4 of the FCAS 5 is thus in direct contact with all surface portions of the substrate 15 covered by the FCAS 5. In FIG. 1, a surface portion of a main surface 20a of a mounting substrate 20 as well as an upper main surface and at least two sidewalls of the chip 10 are in direct contact with and thus directly abutting and adjoining the polymer material 4 of the FCAS 5. The polymer material 4 thus forms a solid material block comprising a support interface surface 6 directly contacting and thus adjoining the substrate 15 (glueless connection). The position of the support interface surface 6 adjoining the substrate 15 or substrate surface 16 is indicated explicitly in FIG. 2 as a hatched, lowermost region of the FCAS 5.

Figure 2:
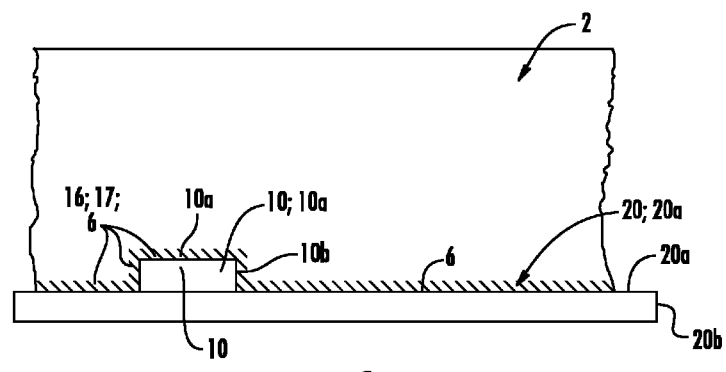
FIGS. 2 to 5 show method steps of an exemplary embodiment of a method of forming a fiber coupling device.
Figure 3:
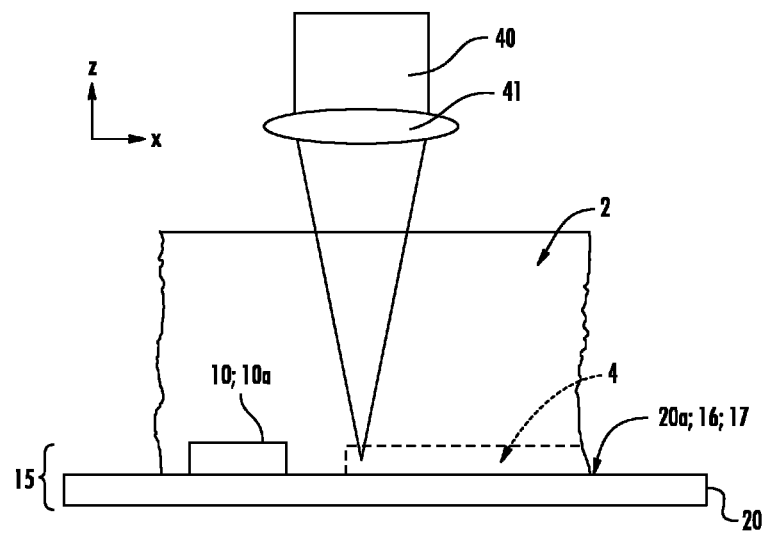
Figure 4:
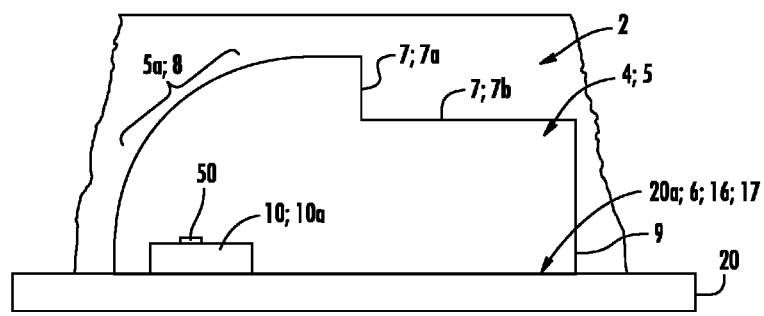

FIG. 2 and FIGS. 3 and 4 alike show an intermediate product during manufacture of the fiber coupling device 1, with the intermediate product still comprising a precursor polymerizable material 2 for the final polymer material to be formed in directly abutting contact to the substrate surface 16. The support interface surface 6 of the FCAS 5 of the final fiber coupling device 1 (as shown in FIGS. 4 to 8 by reference sign '6' at the bottom of the solidified polymer material 4) will be arranged at the same position, particularly at the same height above or distance from the substrate main surface 10a and/or 20a, as the precursor polymerizable material 2 in FIGS. 2 to 4. However, the final interface surface 6 of the fabricated fiber coupling device 1 may be a part or a partial interface surface of and thus may be arranged within the lateral extensions and/or outer contour of the interface surface spanned by the precursor polymerizable material 2 in FIGS. 2 to 4; since the conversion into the polymer material 4 may be performed selectively, that is only in a portion of the entire substrate main surface of the substrate.

In the illustrated example of FIG. 1, the support interface surface 6 comprises most part of the main surface 20a of the mounting substrate 20, the upper main surface 10a of the chip 10 facing away from the mounting substrate 20 and further comprises two opposite sidewalls 10b of the chip 10. Since in the final fiber coupling device 1 of FIG. 1 the polymer material 4 of the FCAS 5 forms a support interface surface 6 directly contiguous to the substrate surface 16 of the substrate 15; 10; 20 and in direct contact to it, the FCAS 5 and the substrate 15 combinedly form, as an integral part, the fiber coupling device 1 with no inherent problem of proper positional (lateral and/or vertical) adjustment between the outer shape of the FCAS 5 and the substrate surface 15. Particularly, the exposed outer contour of the FCAS 5 is in an aligned position relative to the at least one optoelectronic or photonic element 50 on the chip 10 or substrate 15.

This optically aligned position of the FCAS 5 relative to the element 50 includes an aligned position, relative to the element 50, of the fiber support region 7 where at least one fiber 30 is mountable. Hence, the fiber coupling device 1 of the present application inherently ensures high coupling efficiency, once a fiber will be mounted to the fiber coupling device 1, and allows much larger tolerance margin for self-aligned fiber mounting or even for active fiber mounting, since no positional offset or mismatch between the fiber support region 7 and the optoelectronic or photonic element 50 does occur.

The FCAS 5 of the fiber coupling device 1 comprises an outer contour or shape exposed to the ambient atmosphere or air; with the exception of the support interface surface 6 directly contacting the substrate and, upon fiber mounting, also with the exception of the fiber support region 7 to be connected to an endpiece of at least one optical fiber 30 by means of a thin layer of glue or another adhesive.

The FCAS 5 comprises one or a plurality of fiber support regions 7. The at least one fiber support region 7 may comprise a fiber support surface 7b (see FIGS. 4, 5, 7 and 8) which may be formed as a U-shaped or V-shaped groove (in the yz-plane perpendicular to the drawing plane), with a main extension along a direction 'x' which predefines the axial direction 'a' of an optical fiber endpiece (explicitly illustrated in FIGS. 1 and 6) to be glued into and/or onto it. The fiber support region 7 may further comprise a coupling surface 7a (see FIGS. 4 to 8, for instance) facing a fiber endsurface at the axial end of the fiber endpiece. When the fiber is mounted to the groove, a beam B of electromagnetic radiation R (FIG. 1) such as visible light propagates in the polymer material 4 of the FCAS block between the coupling surface 7a and the optoelectronic or photonic element 50. Likewise, a plurality of respective beams may propagate, in the polymer material 4 of one or plural FCAS blocks, between a plurality of fiber endpieces and a plurality of optoelectronic or photonic element 50 of the chip 10 or substrate 15. The fiber endpiece of any optical fiber 30 may be glued very closely to and thus fitted to the fiber support region 7, for instance by pressing it against a thin film of glue material in the groove and/or against the coupling surface 7a. Since only a thin layer of glue or adhesive is provided between the fiber contour and the contour of the fiber support region 7 of the FCAS 5 and since the fiber support region 7 is in optical alignment with respect to the respective element 50 underneath the FCAS 5, so high coupling efficiency is ensured.

But even in case of non-ideal positioning of the fiber endpiece at the fiber support region 7, a relatively high quality connection between the fiber endpiece and the element 50 is still achieved, since the outer contour of the FCAS 5 (including the contour defining the fiber support region 7) already is in an optically aligned position relative to the element 50. This is mainly due to the circumstance that, at the bottom of the FCAS 5, the polymer material 4 is directly adjoining the substrate surface of the chip 10 without any misalignment conventionally caused by the necessity of connecting the FCAS 5 to the substrate by means of an intermediate adhesive material layer. In conventional fiber coupling devices, the polymer material 4 of the FCAS 5 is thus not grown on the substrate surface directly, but instead is first shaped separately as an extra part and is then glued to the substrate 16, thus requiring an additional material layer beneath the bottom interface surface of the FCAS 5. Such a conventional construction (placing glue beneath the bottom surface of the conventionally preshaped FCAS structure) significantly reduces the margin or positional tolerance left for sufficiently high quality fiber coupling, even if the assembly is monitored closely. However, the FCAS 5 of the fiber coupling device 1 of the application does not have any significant lateral or vertical offset from its ideal position relative to the optoelectronic or photonic element 50, since the FCAS 5 and the substrate 15 combinedly form an integral part without any additional layer of glue between them. This qualifies an improvement especially over conventional fiber coupling devices having a molded, particularly injection molded FCAS 5, which vary in size and have imprecise dimensions due to dimensional shrinkage and/or geometrical distortions when cooling off after injection molding, and which further have to be positioned, as best as yet possible, on an additional layer of adhesive material to be applied to the substrate surface.

In conventional fiber coupling devices, the process window for proper positioning and thus for sufficiently high coupling efficiency is further narrowed by the need to mount or to design a reflection surface for deflecting the direction of main propagation of the light beam B, in its path of travelling between the optoelectronic or photonic element 50 and the fiber endpiece or fiber coupling surface, by an angle of about 90°. This is due to the circumstance that an element 50 mounted on the chip's main surface 10a is usually emitting or receiving light from or to a direction substantially normal to the chip's main surface 10a. Accordingly, in FIGS. 1 and 2 the beam B of radiation R is to propagate, near the chip 10, in a direction corresponding to the normal direction 'n' or vertical direction z, or deviating from such a direction by an angle of less than 45°, such as less than 20°. On the other hand, when the endpiece of an optical fiber is to be coupled to the element 50 of the chip 10 or substrate, the height of the entire fiber coupling device 1 (including the fiber endpiece) shall not be unreasonably high. Accordingly, in order to form rather flat devices, fibers endpieces are usually mounted in parallel to the main surface of the substrate 15, chip 10 and/or mounting substrate 20. Accordingly, light propagation near the fiber endpiece needs to be substantially parallel to the main surface, whereas light propagation near the element 50 needs to be substantially normal to the main surface. Thus further means are required for deflecting the direction of beam propagation by approximately 90° from vertical to horizontal or vice versa. Conventionally, transmitters or receivers for low-cost optical connectivity are produced in wafer-level processes, the optical axis of the light to be transmitted or received thus being normal to the chip's main surface. The chips are mounted with their second, opposite main surface on a printed circuit board or mounting substrate. Finally, electrical contact pads (not illustrated) on the upper main surface of the chip are connected, for instance by thin wire bonds, to the mounting substrate. To avoid an unreasonable height of the fiber coupling device, the optical fiber should extend, at the connected fiber endpiece, in parallel to the main surface 20a of the mounting substrate 20 or printed circuit board; an optical mirror oriented at an angle of about 45° thus being required. Such a reflection surface is at least needed as long as the chip 10 shall be oriented in parallel to the mounting substrate.

Accordingly, optical coupling efficiency between the optical fiber 30 and the at least one optoelectronic or photonic element 50 additionally depends on the position and orientation of a reflection surface 8 (FIG. 1) additionally required for the fiber coupling device 1.

Conventionally, additional parts such as mirrors or coatings may be provided. But even in case the outer contour or shape of the fiber coupling alignment structure 5 includes and constitutes the refection surface 8, the path of light propagation is further influenced by any distortions and/or misplacements of the reflection surface 8, due to injection molding and subsequent gluing onto the substrate, which adds up to any further positional mismatch of the fiber support region 7 relative to the element 50 of the substrate 15. According to FIG. 1 and the further embodiments of the present application, even the reflection surface 8 forms part of the integral structure comprised of the substrate 15 and the FCAS 5, thus ensuring proper positioning of both the reflection surface 8 and the fiber support region 7 relative to the element 50, both in lateral and vertical directions. As a result, along the entire light path between each optoelectronic element 50 and the respective coupling surface 7a of the fiber support region 7, no such adverse effects impairing coupling efficiency can occur.

The reflection surface 8 is an exposed first polymer surface portion 5a exposed to the ambient atmosphere or air; it is designed for internal reflection of a light beam propagating on the inside of the FCAS 5, between the element 50 and the fiber support region 7. The reflection surface 8 is located, oriented and/or formed such as to deflect the light beam B propagating inside the FCAS 5 by an angle of about 90°, for instance by an angle of between 45° and 135°, such as between 75° and 115°. In the exemplary embodiment of FIG. 1, the first surface portion 5a of the outer contour or shape of the FCAS 5 is formed as a part of a cylindrical, spherical or aspherical surface. In particular, the mirror or reflection surface 8 is shaped to focus the beam of light in two directions, thus collimating the beam B of radiation R between the element 50 and the fiber support region 7. With the fiber coupling device 1 of the application, even at the reflection surface 8 of the FCAS 5 no deviation or offset from the ideally deflected light path can occur within the FCAS 5.

With all these benefits, it is unnecessary to actively measure coupling efficiency as sometimes conventionally required by obtaining feedback information such as the receiver signal or the light intensity or power in the fiber representing the coupling efficiency to be maximized. Moreover, the integrally formed, one-piece construction of the entire fiber coupling device 1 ensures a very broad tolerance for the final gluing of the fiber endpiece onto the fiber support region 7. Particularly, the integral-formed part includes the substrate 15 as well as the support interface surface 6, the reflection surface 8 and the fiber support region 7 of the FCAS 5. Accordingly, fast and very inexpensive fiber coupling is ensured using passive alignment with very relaxed tolerance conditions regarding the final position of the fiber 30.

FIGS. 2 to 5 show steps of an exemplary method of forming the fiber coupling device 1 of FIG. 1 or of the fiber coupling device of any other embodiment of the application. Like FIG. 1, FIG. 2 shows a cross-sectional view along the directions x and z. First, the substrate 15 is provided, for instance by mounting at least one chip 10 on a mounting substrate 20. As in FIG. 1, the chip 10 is mounted with its main surface 10a in parallel to the main surface 20a of the mounting substrate 20, but facing away from it. Particularly, electrical contacts (not illustrated) for contacting the at least one optoelectronic or photonic element 50 and provided on the upper main surface 10a of the chip 10 are connected to the mounting substrate 20. With this or another kind of substrate 15 (as discussed in detail above) provided, the method comprises a step of applying a polymerizable material 2 to at least a portion of the substrate surface of the substrate 15. In FIG. 2, a surface portion 17 thus covered with the polymerizable material 2 includes a main surface 10*a* of the at least one chip 10, the sidewalls 10*b* (all of them or at least two of them) of at least one chip 10 and a portion of a main surface 20*a* of a mounting substrate 20 extending beyond the lateral extensions of the chip 10. At this stage, the polymerizable material 2 directly adjoins and covers the substrate surface 16 which includes a substrate surface portion 17 on which solidification into polymer will be caused later. In FIG. 2, on the substrate surface 16, the polymerizable material 2 in direct contact with it is indicated as a lowermost, hatched region of the polymerizable material 2; at the bottom of this hatched region the support interface surface 6 will be formed upon polymerization of the polymerizable material 2. By the way, depending on how the method is executed, the polymerizable material 2 may cover only a portion 17 of the main surface 20*a* of the mounting substrate 20 or may even extend beyond and partially cover sidewalls 20*b* of the mounting substrate 20.

The polymerizable material may particularly be a resist material. Some exemplary polymerizable materials are chalcogenide glasses such as $As_2S_3$, IP-resists, for instance acryle-based resists, organically modified ceramics (OR-MOCERs) and, generally, both positive and negative resists prone to polymerization upon supplying energy by means of illumination, particularly by means of laser radiation, for instance by means of infrared laser radiation. Particularly, any material capable of laser-induced polymerization, and thereby solidification, is suitable for the methods of the application.

According to FIG. 3, a step of partially, selectively polymerizing the polymerizable material 2 into a polymer material 4 is executed. For this method step, any technique of 3D or three-dimensional lithography may be applied in order to form a three-dimensionally shaped polymer structure, namely the FCAS 5, within the volume of the polymerizable material 2. Due to the application of a technique of 3D-lithography in this method step, it is feasible to shape a fiber coupling alignment structure 5 out of polymer material 4 with a shape that is designed not only in two lateral directions x, y but also along the third dimension or vertical direction z, thus enabling a creation of a precisely manufactured contour of the solidified region within the polymerizable material 2 that will finally constitute the outer shape of the FCAS 5 to be formed. Moreover, since from the beginning the polymerizable material 2 directly covers the substrate surface 15, particularly the main surfaces 10*a* and 20*a* of the chip 10 and of the mounting substrate 20 (FIG. 2), the FCAS 5 may be grown starting directly on the substrate surface, thereby inherently forming it in direct contact with the substrate and thus without any misalignment to the optoelectronic or photonic element 50 of the chip. This ensures that no deviation of the final position of the FCAS 5, particularly of its fiber support region 7 and its reflection surface 8, with regard to the position of the element 50, does occur.

For polymerizing and thus solidifying the polymerizable material 2 to the polymer material 4, any 3D-lithographic technique may be applied. Among them, laser-induced polymerization such as 3D-laser printing (3D-laser scanning), or 3D-holographic lithography (particularly dynamic maskless 3D-holographic lithography; DMHL) may be applied. FIG. 3 shows an embodiment using 3D-laser printing by means of a laser beam 40 collimated by a collimator lens 41 to a focal region where laser intensity is sufficiently high to locally polymerize and thus convert the polymerizable material 2 to the solid polymer 4. The laser generating the laser beam may particularly be an infrared laser. The 3D-lithographic techniques exploited according to the application may be performed using two-photon-polymerization, thereby restricting the region where polymerization actually takes place to the focal region of the focussed laser beam 40. Accordingly, only in the focal region the laser intensity is high enough to provide sufficient likelihood for two photons to be available at a time for monomers to combine to a polymer, whereas outside the focal region statistically only one photon will be available, thus failing to provide sufficient energy to trigger polymerization.

As indicated in FIG. 3, the laser beam 40 is controlled so as to move its focal region throughout the volume of the polymerizable material 2, thus leaving tracks of solid polymer material 4 which add up to finally form the FCAS 5. For instance, according to FIG. 3 the laser focus is first moved in a lowermost region at or closely above the substrate surface 16 of the chip 10 and/or of the mounting substrate 20, thus first forming the fiber support region 6 directly adhering to the substrate surface 16, for instance by scanning along both lateral extensions x, y within the footprint of the FCAS 5 to be formed. Thereafter, laser scanning may be continued or repeated in positions or planes more distant from the substrate surface of the mounting substrate. The laser is controlled such that the track of the laser focal region moved throughout the complete volume of the FCAS 5 to be formed of the polymer 4. Particularly, the outer contour of the polymerized region may be shaped according to the movement of the laser focal region along or closely within the desired, predefined outer surface of the FCAS 5; this track movement is adjusted with reference to the position of the at least one optoelectronic or photonic element 50 of the chip 10. Any positional offset of the chip 10 or of its element 50 from a desired position, if detected before or during the step of locally solidifying the polymerizable material, may instantly be compensated by adjusting the path or track of the laser focal region through the three-dimensional volume of the polymerizable material. For instance, in case that the chip 10 is observed to be offset along the positive lateral x direction, the entire track of the laser beam can be controlled to be shifted and thus offset, also along the positive direction x, thus compensation the offset of the actual, initial or current chip position. Thereby the outer contour of the FCAS 5, particularly the reflection surface 8 and of the fiber support region 7, are placed, during their formation, in predefined ideal positions relative to the position of the optoelectronic element 50 of the substrate or chip.

FIG. 4 shows the result of 3D lithography, with the region of solidified polymer material 4 constituting the volume and thus the shape of the FCAS 5 shown in FIG. 1. Although still embedded in the surrounding, liquid polymerizable material 2, the FCAS 5 already comprises all final surface portions such as the reflection surface 8 and the fiber coupling region 7, both optically aligned with the position of the optoelectronic or photonic element 50. The fiber coupling region 7 specifically may comprise a coupling surface 7*a* (through which the radiation passes before or after having passed the end of an optical fiber 30) as well as a fiber support surface 7*b* shaped as a groove or otherwise designed to at least partially surround and thereby receive an outer circumferential fiber surface of the optical fiber 30 or of its cladding or coating. Both surfaces 7*a*, 7*b* are in an adjusted position relative to the substrate and its element 50, and the same is true for the reflection surface 8. Since the track or movement of the laser focal region and thus of the outer shape of the FCAS 5 is controlled and, if necessary, adjusted during its formation in-situ on a real-time basis, from the beginning of the polymerizing step any misalignment is inhibited and/or compensated. Accordingly, the FCAS 5 is built up voxel-by-voxel by writing with laser light (e.g., such as using a pulsed laser, such as a pulsed infrared laser, for instance) directly onto a printed circuit board and/or on the chip 10. In contrast to two-dimensional lithographic techniques as used in semiconductor manufacturing, the three-dimensional lithographic techniques applied here are contactless and thereby give entire freedom regarding the design, also along the vertical direction z or distance from the substrate, for the FCAS 5 to be shaped. Very high precision within the range of sub-micrometer resolution is easily obtained by 3D-lithography as applied here. At the same time, great progress in the writing speed of 3D laser lithography (currently in the order of 5 meters per second or even higher) contribute to a fast build-up of the FCAS 5 directly on the substrate 15. Furthermore, laser scanning is extremely flexible with regard to the outer contour of the polymer structure to be tailored, since any arbitrary outer or inner surface can be shaped by appropriately leading the laser beam focus through the polymerizable material 2. For instance, complex shapes like curved mirrors for optical components (such as the reflective mirror 8 or even other convex or concave lens surfaces) may be designed thereby. Due to the increased writing speed, large-scale production becomes affordable. Alternatively to 3D laser scanning as depicted in FIG. 3, holographic lithography or other techniques of 3D lithography may be applied instead.

Figure 5:
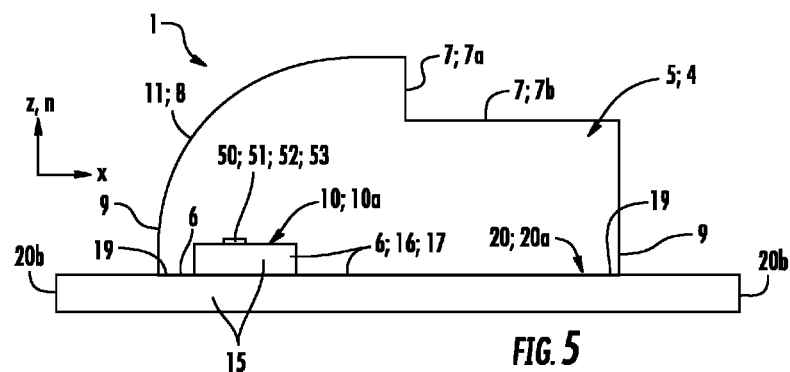

As apparent from FIG. 5, after having completed 3D lithography and thus generated the solidified polymer structure serving as the FCAS 5, all that is left to do by the practitioner is to clean the substrate 15 and the FCAS 5 formed of solid polymer material 4 from any remaining non-polymerized material 2, thereby exposing the preformed FCAS 5 of the fiber coupling device 1. In this context, exposing means uncovering the FCAS 5, particularly uncovering the FCAS 5 from unpolymerized polymerizable material. Of course, in this context, 'exposing', that is 'uncovering' is not related to the term 'exposure' as used in conventional lithographic processes in which a mask is formed in contact with the layer which is then 'exposed' lithographically, that is subjected to light for patterning the mask. In the current context, 'exposing' neither is related to any kind of 'exposure' to an etchant, as is the case in conventional lithography when the mask has already been patterned and the layer underneath, through openings in the patterned mask, is 'exposed' to the etchant. Instead, as stated above, in the claims of the present application, particularly in independent claims 1 and 24, 'exposing' means 'uncovering', that is freeing of the polymerized FCAS structure 5 from the non-polymerized material around it. Consequently, when the polymerized material has been uncovered, the FCAS structure 5 is exposed to the ambient air. The exposed FCAS 5 of the fabricated fiber coupling device 1 comprises a support interface surface 6 directly adjoining the substrate surface 16; 20a; 10a; 10b (see FIG. 2) or at least a surface portion 17 thereof. As no step of mounting the FCAS 5 onto the substrate 15 is required any more, optical alignment between the FCAS 5 and the substrate 15 is guaranteed. As further apparent from FIG. 5, the FCAS 5 comprises edges 19 confining the support interface surface 6 as well as sidewalls 9 adjoining the support interface surface 6 along the edges 19. Especially when the entire footprint of the FCAS 5 is within the lateral extensions the substrate 15, the sidewalls 9 of the FCAS 5 are offset relative to the sidewalls 20b of the mounting substrate 20. The substrate thus serves as a support surface for the entire fiber coupling alignment structure 5; in these embodiments the sidewalls 9 of the FCAS 5 and the sidewalls 20b of the substrate 20 supporting the FCAS 5 may be offset from one another rather than flush with one another.

As a final step, as apparent from FIG. 1, an endpiece of an optical fiber 30 may be glued onto the fiber support region 7. This final mounting step (self-aligned due to the conformity of the fiber support surface 7 to the fiber circumferential surface) profits from the great tolerance already achieved by the highly precise positioning of the FCAS contour, particularly of its fiber support region 7, reflection surface 8 and support interface surface 6, relative to the substrate. As a consequence, when mounting the optical fiber 30, high optical coupling efficiency is achieved.

A further benefit is that the step of mounting the fiber endpiece may be postponed to any later point in time, after fabrication of the fiber coupling device 1 per se (including the FCAS 5) has been completed. Accordingly, the fiber coupling devices 1 may be fabricated, stored and distributed long before the end user will mount optical fibers to them. And when the end user will mount a fiber, high coupling efficiency is achieved without further special alignment measures being required.

Figure 6:
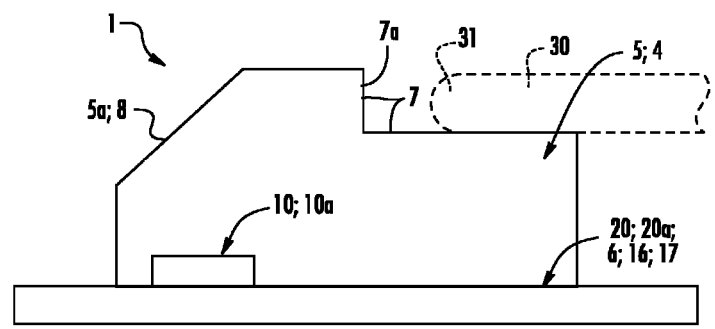
FIGS. 6 to 8 show alternative exemplary embodiments of fiber coupling devices.
Figure 7:
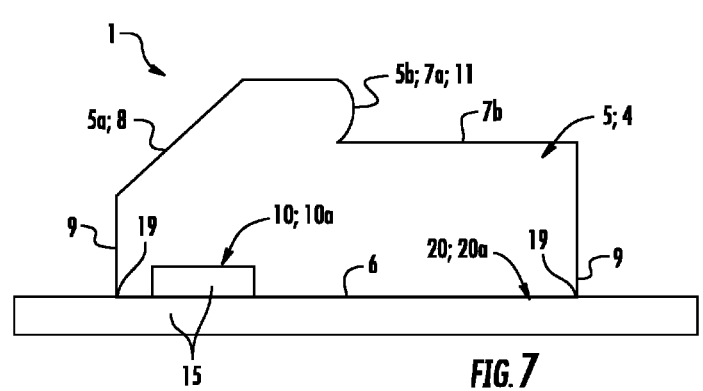
Figure 8:
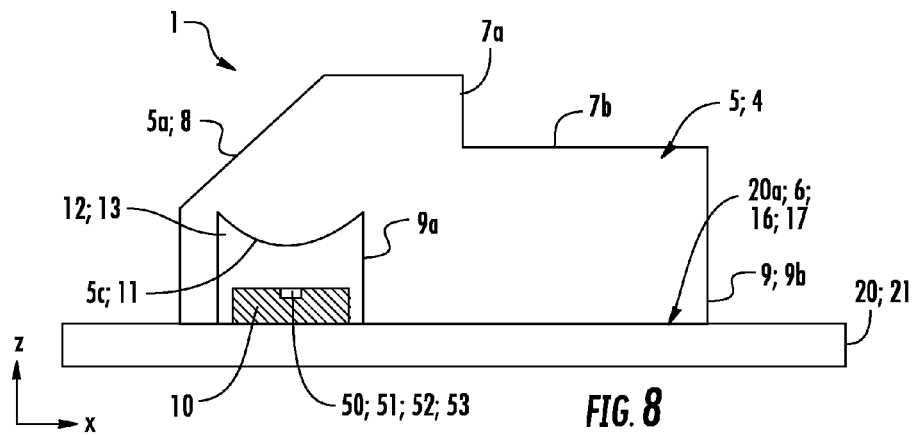

FIGS. 6 to 8 show alternative exemplary embodiments of fiber coupling devices obtainable by exploiting 3D lithography. According to FIG. 6, the reflection surface 8 is planar or flat rather than curved; with a uniform inclination angle of about 45° or at least between 40° and 50°. Here, the FCAS 5 does not comprise curved surfaces serving as a lens for collimating the light beam. However, instead the endpiece 31 of the optical fiber 30 may be curved, at its axial end facing the coupling surface 7a, to achieve the collimating effect.

For instance, the axial end surface of the fiber endpiece 31 may be formed spherically or aspherically. In FIG. 6, the distance between the axial fiber end surface and the coupling surface 7a of the fiber support region 7 is illustrated larger than actually chosen. The FCAS 5 can be designed such that maximum coupling efficiency is achieved when the fiber end surface directly contacts, at least with its central end surface region, the coupling surface 7a or when a predefined minimum gap or distance between them to be filled with glue or adhesive material is left.

FIG. 7 shows another embodiment in which the FCAS 5 comprises a curved surface. However, in FIG. 7 the coupling surface 7a, that is another, second surface portion 5b than the first surface portion 5a used as the reflection surface 8, is curved so as to form a lens 11 or lens surface. Throughout FIGS. 1, 4 to 7 and 8 it is to be understood that in the plane perpendicular to the direction x the fiber support surface 7b of the fiber support region 7 is formed such as to receive the outer, circumferential surface of a fiber 30 or of its cladding (or even of its coating) in a self-aligning manner, with almost no leeway being left except for the thickness of a thin layer of glue or adhesive. The fiber support surface 7b may for instance be a groove, such as a U-groove or a V-groove. The application of 3D laser printing or of another 3D-lithography technique allows precise shaping such as lens surfaces and other complex curved surfaces out of the polymerizable material 2, such as the reflection surface 8 in FIG. 5 or the coupling surface 7a in FIG. 7.

FIG. 8 shows a further embodiment of a polymer structure 5 formed using 3D lithography and comprising inner sidewalls facing a cavity 12. According to FIG. 8, the FCAS 5 formed of the polymer 4 bridges over the chip 10 which may be arranged on a mounting substrate 20. However, the polymer material 5 neither contacts nor conforms to the shape or surfaces of the chip 10. Instead, the polymer material 4 forms inner sidewalls 9a as well as a lens surface 11 above the chip 10; these surfaces confine a cavity 12 or bridged region 13. In the second lateral direction y, the bridged region 13 may be open on one or both sides, thus enabling removal of non-polymerized material 2 from the cavity 12 enclosed between the FCAS 5 and the mounting substrate 20. The height of the bridged region 13 or cavity 12 is larger than the thickness of the chip 10 on the mounting substrate 20.

The lens surface 11 (third surface portion 5c) formed at the ceiling of the cavity 12 or bridged region 13 forms a collimating lens within the path of electromagnetic radiation propagating between the element 50 of the chip 10 and the coupling surface 7a of the fiber coupling device 1. Of course, the cavity 12 and/or bridge region 13 may be combined with other features of the FCAS 5 of any figure or other embodiment of this application. Due to the cavity 12 shown in FIG. 8, the support interface surface 6 of the FCAS 5 only comprises surface portions 17 of the substrate surface 16 of the mounting substrate 20 or printed circuit board 21, without abutting any surface portions of the chip 10 or of its optoelectronic or photonic element 50. Thus even inner surfaces 9a, 11 defining a cavity 12 or a bridged region 13 may easily be formed to realize embodiments similar to FIG. 8, due to the adaptability of geometrical shapes formed by 3D lithography.

All embodiments of fiber coupling devices 1 presented in the application may be formed by a manufacturing method as defined in the claims, particularly using laser scanning as illustrated in FIGS. 2 to 5. Alternatively, any other technique of 3D lithography than 3D laser printing may be applied, for instance holographic lithography. Although these methods are known as such, application of such methods to the formation of fiber coupling alignment structures on a substrate is not known so far.

The techniques of 3D lithography may likewise be applied to substrates that do not include a mounting substrate. Particularly, the FCAS 5 may be grown by means of 3D lithography on an optoelectronic, photonic or photonically integrated chip 10 only. Accordingly, one or a plurality of fiber coupling alignment structures 15 may be formed on a single chip 10 or any other single piece of substrate.

Figure 9:
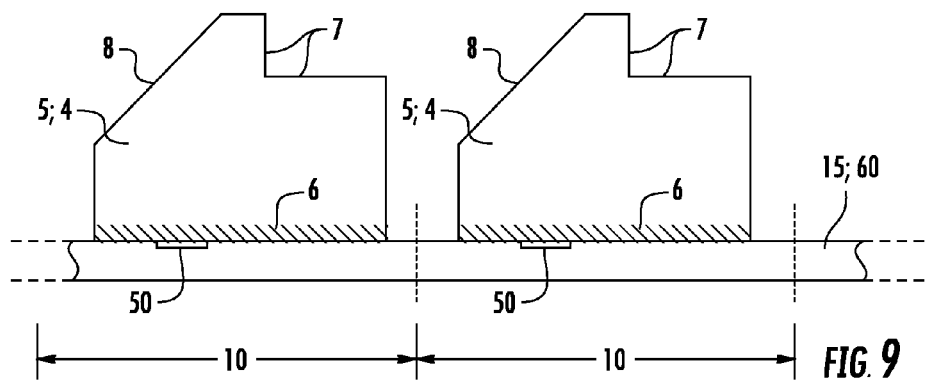
FIG. 9 shows an embodiment for the fabrication of fiber coupling alignment structures on a wafer-level basis.

As shown in FIG. 9, the chip or substrate may also be a wafer 60, for instance a semiconductor wafer not yet singulated by dicing. The surface of a wafer 60 may thus be used as the seeding plane for growing a large plurality of fiber coupling alignment structures 5 on a two-dimensional array or pattern of optoelectronic or photonic elements 50. The method of the application may thus be executed on a wafer-level basis, with a wafer comprising a two-dimensional array of rectangular wafer areas each intended to represent a respective chip surface area for a chip of a respective fiber coupling device 1 to be formed. Accordingly, a plurality of fiber coupling alignment structures 5 may be formed on one single wafer. After the fiber coupling alignment structures 5 are grown onto the wafer surface areas, the wafer 60 is singulated, which is diced into a plurality of chips 10, each comprising at least one respective FCAS 5 of polymer material 4 in direct contact with its chip surface 10a. Upon dicing, a plurality of fiber coupling devices 1 is obtained, each ready for mounting of a respective fiber 30 with high coupling efficiency.

Figure 10:
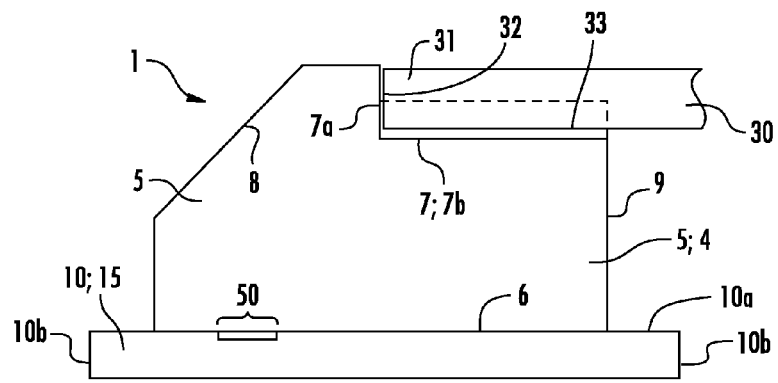
FIG. 10 shows an embodiment for the fabrication of a fiber coupling alignment structure directly on a single chip.
Figure 11:
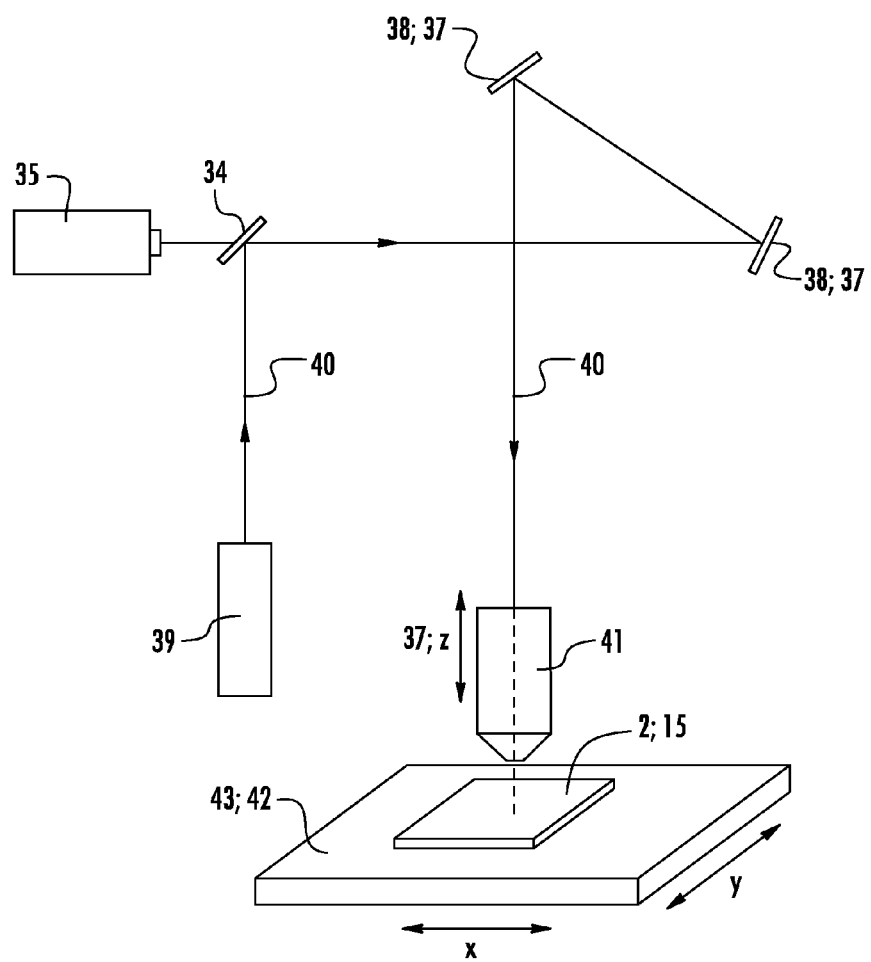
FIG. 11 shows an exemplary apparatus for the fabrication of fiber coupling alignment structures using the technique of three-dimensional laser printing.

As illustrated in FIG. 10, instead of producing on a wafer-level basis or on a combined substrate comprising a mounting substrate 20, alternatively one or a plurality of diced or otherwise pre-shaped optoelectronic, photonic or photonically integrated chips 10 may be used as the substrate 15 for growing FCAS structures 5 on it or them. In this case, the fiber coupling alignment structures 5 are grown, by an appropriate 3D lithographic technique, directly on the main surface 10a of the respective chips 10. Whereas according to FIG. 10 one large FCAS 5 covers the most part of the main surface 10a of an individual chip, alternatively a plurality of such structures 5, each one small in size compared to the lateral extensions of the main surface 10a of the chip 10, may be formed, either simultaneously or one after the other, on the same respective chip 10. The size of the chip 10 and the size and lateral dimensions of the FCAS structures 5 may be chosen appropriately in view of the total number and arrangement of optoelectronic or photonic elements 50 on the chip 10. In FIG. 10, the axial fiber endsurface and the outer circumferential surface of the fiber endpiece 31 are denoted with 32 and 33, respectively. As further apparent from FIG. 10, there is a gap or distance between the fiber support region 7 (comprising the coupling surface 7a and the fiber support surface 7b) and the fiber endpiece 31 (comprising the fiber endsurface 32 and the circumferential surface 33) which gap or distance is filled with an adhesive (not shown), such as with a conformal layer of adhesive. Accordingly, there is a glue layer or other adhesive layer connecting the fiber support surface 7 to the fiber endpiece 31. Thus the surfaces 7a, 7b of the polymer material 4 of the FCAS 5 are not in direct contact with the fiber surfaces 32, 33 but are arranged at a small but finite distance from these fiber surfaces 32, 33. On the other hand, at the bottom of the FCAS 5, there is no glue layer or other adhesive layer between the support interface surface 6 and the substrate 15. FIG. 11 schematically shows an exemplary apparatus for 3D-laser printing for formation of the fiber coupling alignment structures. The substrate 15 or plurality of substrates (such as chips, mounting substrates or other kinds of substrate arrangements) is arranged on a movable stage 42 whose lateral position along the directions x, y is controllable by a lateral scanning actuator drive 43. The substrate 15 is covered with a polymerizable material 2. The layer of polymerizable material 2 may be sandwiched between the substrate 15 and a glass plate (not shown) on top of it, thereby ensuring a uniform thickness of the polymerizable material defining the vertical range of laser focus movement. A laser beam 40, generated by a laser source 39, is collimated by a collimator lens 41, such as a microscope objective. In FIG. 11, the vertical distance between the collimator lens 41 and the substrate 15 is exaggerated; actually the collimator lens 41 is arranged closely above the layer of polymerizable material 2 on the substrate 15. The collimator lens 41 strongly collimates the laser beam 40 in diameter, thereby obtaining a confined focal region in with laser intensity exceeds a threshold intensity value needed for sufficient likelihood to trigger two-photon-polymerization. This focal region is positioned at a certain vertical position z within the layer of polymerizable material 2. The laser beam may in particular be an infrared laser beam.

The apparatus comprises a focal depth actuator unit 37 for controlling the vertical position of the focal region of the laser beam 40. The focal depth actuator unit 37 may comprise, apart from a unit for lifting and lowering the collimator lens 41, two mirrors 38 for achieving real-time adjustment of the laser focus vertical position during 3D-laser printing. Also the lateral movement of the movable stage 42 or substrate support is actuated or controlled so as to provide real-time adjustment of the momentary lateral x and/or y position of the laser focal region and relative to the layer of polymerizable material 2 on the substrate 15.

For observing the substrate surface directly during the process of laser printing, a digital camera 35 observing exactly along the direction of the laser beam 40, through a semi-transparent mirror 34, is used. Within the volume of the polymerizable or otherwise photosensitive material, upon two-photon absorption, local polymerization occurs in those spatial regions of the polymerizable material 2 temporarily passing the focal region of the laser. A pulsed laser is effective and typically used. The energy and number of ultra-short laser pulses applied may be controlled to adjust the size of the focal region where two-photon absorption and thus polymerization shall occur. The pulse duration of the laser beam may, for instance, be below 100 femtoseconds, and the pulse rate may be in the order of 45 MHz. A scanning resolution of 100 nm or even smaller is achievable using 3D lithography. The wavelength of the laser typically is within the range of infrared wavelengths, for instance in the range between 800 nanometers and 100 micrometers.

The positioning of the stage 42 during 3D lithography may be accomplished using piezoelectric scanning actuator drive means, for instance. Positive-tone photoresists as well as negative-tone photoresists, either both solid or liquid ones, may be used. After having scanned the polymerizable material and thereby built up the three-dimensional polymer structure or polymer structures constituting the respective FCAS 5, the non-polymerized material is washed off of the substrate 15.

Since during 3D-laser printing (3D-laser scanning) the position of the focal region is travelling along the three-dimensional volume of the resist layer of polymerizable material 2 with the vertical position of the focal region being additionally controlled within the range of the thickness of the layer of polymerizable material 2, three-dimensional polymer structures having shapes whose lateral dimensions vary in a predefined manner along the height of the polymer structure can be formed. Thus, in contrast to two-dimensional lithographic techniques requiring masks and etching from above through a patterned mask, a greater variety of structures may easily be formed. By observing the substrate surface, using the digital camera 35 such as a CCD or CMOS camera through the semi-transparent mirror 34 as in FIG. 11, along the direction of the laser beam, the FCAS 5 can be monitored in real time during its growth and thus can be reliably positioned relative to the element 50 on the substrate. Since the same optical vision system (i.e. optical elements such as the mirrors 38, the focal depth actuator unit 37 and the collimator lens 41) are used both for navigating the track of the laser focal region as well as for observing the polymerized structure and the substrate surface on the display of or connected to the camera 35, even observation-related offsets between the observation direction, the observation path and/or the position of the observed substrate surface relative to the path of the laser beam are eliminated.

Thus the fiber coupling alignment structures 5, particularly their reflectors, lenses, other shaped contours and any alignment features for the optical fiber may be shaped and positioned with high precision in the sub-micrometer range smaller than 100 nm. High precision movement of the laser focus inside the resist layer voxel-by-voxel thus generates the entire fiber coupling alignment structures 5 by stepwise or incremental local polymerization. By applying 3D-laser printing or another technique of three-dimensional lithography, the application renders molded optical parts or any further constructional pieces obsolete. Furthermore, these three-dimensional lithographic techniques are contactless, especially since they do not require formation of any mask on the substrate, and may be controlled reliably based on a visual control by means of the visual system. Accordingly, maskless 3D-lithography can be applied for selectively polymerizing the polymerizable material. Furthermore, rapid, inexpensive and real-time correction during 3D-lithography patterning is achieved due to the use of a visual control system. By means of the visual control system, the position and shape of the regions to be polymerized can be controlled prior to exposure or, as a real-time control, even during exposure.

By applying other techniques of 3D-lithography, the above advantages may equally be achieved. For instance, holographic lithography may be applied, particularly dynamic maskless holographic lithography (DMHL) for shaping 3D-structures with dimensions in the micrometer and nanometer range. A further benefit of holographic lithography is that the entire FCAS 5 or plurality of fiber coupling element structures 5 may be formed simultaneously, since the entire three-dimensional holographic pattern is generated simultaneously when exposing the polymerizable resist layer 2 to the laser pattern. Accordingly, a further advantage of holographic lithography is a reduction of time consumption during manufacture, since holographic lithography does not rely on any limited writing speed, since there is no laser focus to be moved along all three dimensions. However, regardless of the specific technique of 3D-lithography applied, after exposure of the polymerizable material 2, a developing step may optionally be performed (depending on the particular resist material chosen) to complete the internal process of polymerization and/or to harden the polymer material. Upon removal of any non-polymerized material 2, all fiber coupling alignment structures are complete.

Due to the application of techniques of 3D lithography such as 3D laser printing/scanning or 3D holographic lithography, for instance, for shaping the FCAS 5, the FCAS 5 not only is an integral part per se (that is a one-piece polymer structure constituting a polymer monoblock) but also forms, together with the substrate, a one-piece integral part constituting the fiber coupling device uninterrupted by any air gap or adhesive material layer; the polymer material 4 of the FCAS 5 conforms to and directly adjoins the substrate material at the substrate surface 16 of the substrate 15. Particularly this contact surface or interface surface between the polymer material and the substrate material is free of any air gap, adhesive or other material or layer. Instead, the polymer material is directly fixed to the substrate material that is to the bulk material of the chip or to the bulk materials of the chip and of the mounting substrate. From the substrate surface, the block of polymer material 4 extends up to the fiber support region 7, without any gap filled with air or any layer of adhesive or other material in between. Accordingly, the fiber support region 7 is arranged in a position optically aligned relative to the position of the optoelectronic or photonic element 50 of the chip.

Due to the techniques of 3D lithography applied for the method of forming the fiber mounting device, the monoblock structure of the FCAS 5 formed thereby may even comprise a shape that includes one or plural overhanging portions, such as the laterally overhanging, convex lens 11 oriented vertically in FIG. 7 or the polymer bridge of the FCAS 5 bridging over the chip and the cavity 12 in FIG. 8, for instance. Particularly, the contour or outer surface of the FCAS 5 may comprise a surface portion that is arranged at a distance from the substrate but, at the same time, is oriented at an angle of more than 90° from the normal direction of the substrate surface (and thus faces, in an inclined orientation, the substrate surface). Furthermore, apart from the laser beam or holographic laser pattern generated, no further additional means are required for shaping the contour of the FCAS 5, thus rendering the manufacturing method less costly. The FCAS 5 can be formed of any laser-solidified polymer, for instance by polymerizing and thus solidifying a polymerizable resist material.

Figure 12:
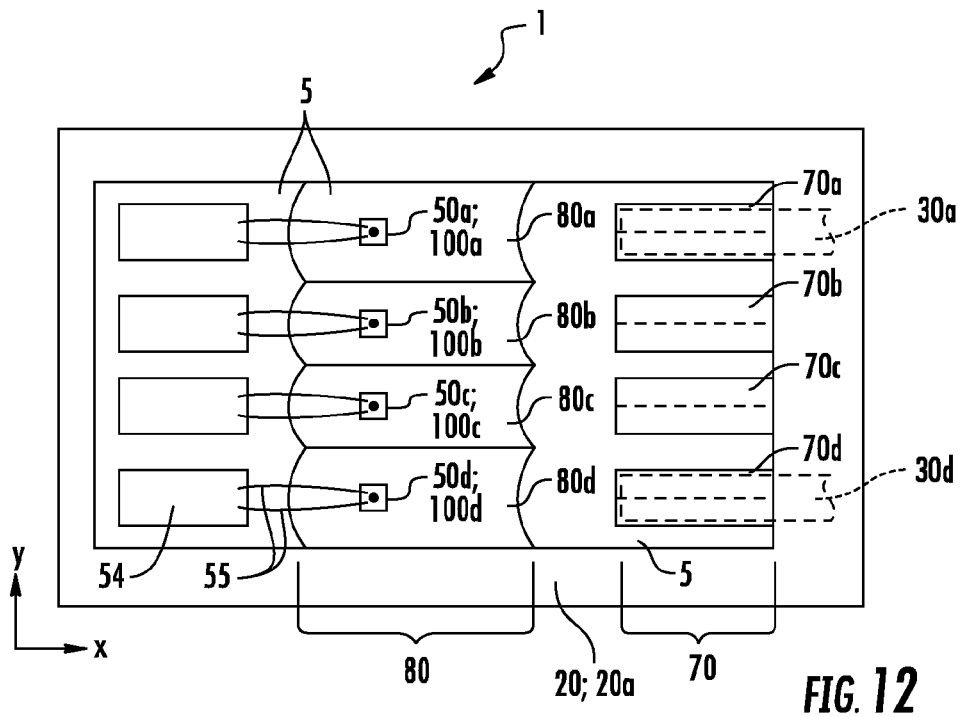
FIG. 12 shows a top view on a fiber coupling device explicitly illustrating the plurality of optoelectronic or photonic elements, such as the fiber coupling device of FIG. 1 or of one of FIGS. 5 to 10.

Finally, at any later point in time after manufacture of the fiber mounting device, the fiber endpiece can finally be mounted, for instance by gluing it onto the fiber coupling alignment structure 5. Since the outer shape of the fiber coupling alignment structure 5 is inherently in optimum position regarding the optoelectronic or photonic element 50 of the substrate, high coupling efficiency is safeguarded with sufficient margin, even before the fiber endpiece is finally mounted by the end user FIG. 12 shows a schematical top view of the fiber coupling device 1 comprising at least one optoelectronic or photonic element, such as the fiber coupling device of FIG. 1 or of one of FIGS. 5 to 10. The fiber coupling device 1 shown in FIG. 12 comprises a plurality of optoelectronic or photonic elements 50; 50$a$, 50$b$, 50$c$, 50$d$. Accordingly, a plurality of optoelectronic or photonic chips 100$a$, 100$b$, 100$c$, 100$d$ is arranged on the substrate surface, that is on the main surface 20$a$ of the mounting substrate 20. In the example of FIG. 12 and the following figures, the fiber coupling device 1 comprises a plurality of, for instance, four optoelectronic or photonic elements 50; 50$a$, 50$b$, 50$c$, 50$d$, that is a plurality of four optoelectronic or photonic chips 100$a$, 100$b$, 100$c$, 100$d$ on the substrate 20. The chips are enclosed and surrounded by the fiber coupling alignment structure (FCAS) and thereby optically coupled or destined to be coupled to four respective, corresponding optical fibers 30 (FIG. 1 or FIG. 10). Each one of the optoelectronic or photonic elements 50$i$ or chips 100$i$ is associated with a respective one of the four optical fibers 30$i$; with 'i' indicating the respective number out of the plurality of elements, chips or fibers; 'i' thus denoting either a, b, c or d.

The fiber coupling alignment structure 5 or FCAS comprises a plurality of four reflection surfaces 80 or 80$i$; that is 80$a$, 80$b$, 80$c$, 80$d$ shown in FIG. 12 in top view, that is from a vertical or normal direction relative to the plane of the substrate surface 20$a$ of the mounting substrate 20. Furthermore, a plurality of four fiber support regions 70; 70$a$, 70$b$, 70$c$, 70$d$ is provided at or near one lateral end of the FCAS along the first lateral direction x. Each fiber support region 70$a$, ..., 70$d$ is designed to receive a respective one of the optical fibers 30$a$, ..., 30$d$ to be mounted to the fiber coupling device 1. The fiber support regions may comprise V-grooves or U-grooves, for instance, as the corresponding fiber support surface 7$b$ (see FIGS. 5 to 10) and may further comprise a coupling surface 7$a$ through which the light is passing when propagating between the respective optoelectronic or photonic element 50$i$ and the associated optical fiber 30$i$.

Generally, a fiber coupling device 1 such as that depicted in FIG. 12 will have identical, that is uniform positions and orientations of the constructional parts constituting the fiber coupling device 1, at least along the directions x and z. Along the second lateral direction y, the position of the respective optoelectronic or photonic element 50$i$, the position of the associated reflection surface 80$i$, the position of the associated fiber support region 70$i$ and, finally, the position of the associated optical fiber 30$i$ to be coupled to the respective optoelectronic or photonic element 50$i$ or chip 100$i$ are expected to be aligned to one another, and conventionally there will be a uniform pitch distance, along the direction y, between identical constructional parts. Furthermore, in a fiber coupling device 1 as depicted in FIG. 12, the first or uppermost fiber support region 70$a$, the first optical fiber 30$a$ and the first reflection surface 80$a$ are expected to have the same y-position as the first optoelectronic or photonic element 50$a$ or chip 100$a$.

In reality, however, due to the small dimensions in sub-millimeter, i.e. micrometer range, despite the stringent positional requirements involved in the need to obtain a high percentage of light transmission between the optoelectronic or photonic elements 50$a$, ..., 50$d$ and the optical fibers 30$a$, ..., 30$d$, small misalignments of the optoelectronic or photonic elements 50$a$, ..., 50$d$ can occur. According to the present application, these misalignments of the chips 100$i$ on the substrate 20 are compensated by compensational offsets of the individual reflection surfaces 80$i$ and/or fiber support regions 70$i$, thereby compensating deteriorations in optical transmission performance otherwise occurring in conventional fiber coupling devices as shown in FIG. 12. In particular, according to the present application, unintentional deviations of the actual positions and/or orientations of the individual optoelectronic or photonic chips 100$i$ from standardized default positions are compensated by the individual offsets of the reflection surfaces and/or fiber support regions 80$i$; 70$i$. In comparison with a conventional design shown of FIG. 12 in which all reflection surfaces and all fiber support regions are located at one and the same position (except for the pitch distance along the second lateral direction y, of course) and orientation, a far better compensation of misalignments and increase in optical coupling efficiency is achieved by the exemplary embodiments of the following embodiments of the present application and their combinations.

FIG. 12 additionally shows control chips 54 in which control circuits may be provided for operating and electrically accessing the optoelectronic or photonic elements 50$i$, that is the optoelectronic or photonic chips 10; 100$i$, which are connected to the control chips 54 by means of bond wires 55. Whereas in FIGS. 1 and 5 to 10 the control chips and bond wires have been omitted for clearer illustration of the optical transmission path, also in the embodiments they are nonetheless present and, preferably, enclosed and surrounded by the polymer material of the FCAS structure 5, as shown in FIG. 12.

The control chips 54 comprising the control circuits may be mounted on the main surface 20$a$ of the mounting substrate 20, like the optoelectronic or photonic chips 10; 100$i$. Alternatively, sub-circuits arranged in the mounting substrate 20 and/or accessible at the main surface 20$a$ of the substrate 20 may be used as the control circuits. The bond wires 55 may thus connect the optoelectronic or photonic chips 100$i$ (with i=a, b, c, d) with the main surface 20 of the support substrate or, alternatively, with the main surfaces of the control chips 54 placed on the mounting substrate. Furthermore, one single control chip and/or control circuit can be provided for all of the plural optoelectronic or photonic chips 10; 100$i$.

Figure 13:
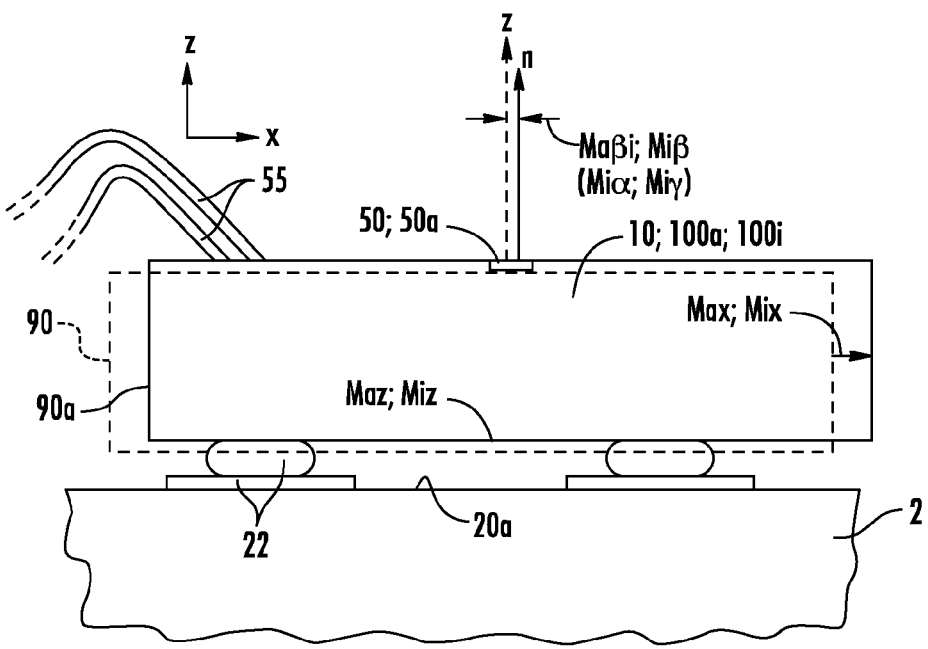
FIG. 13 shows a schematical, cross-sectional side view illustrating actual, individual positions of the optoelectronic or photonic elements of FIG. 1 or FIG. 5 to 10 or 12.

FIG. 13 shows an enlarged, cross-sectional view of an actual position of an individual optoelectronic or photonic chip 100$a$ of the plural optoelectronic or photonic chips 100$i$ shown in FIG. 12. For the sake of clarity of illustration, in FIG. 13 only the position of a single one of these chips 100$i$ is shown. On the substrate surface, such as the main surface 20$a$ of the support substrate 20, support structures 22 may be provided for supporting a rear side or rear surface of the respective individual chip 100$i$. The support structures 22 may, for instance, comprise solder structures, such as solder balls, or bond structures, for instance bond balls. Preferably, the support structure 22 only serves to mechanically fix the respective optoelectronic or photonic chip 100*i* to the substrate 20, whereas electrical contact and access to the chip 100*i* is provided by the bond wires 55 or other kinds of electrical connectors mounted to the opposite surface, that is main surface 10*a* of the respective chip 100*i*; the main surface 10*a* facing away from the substrate 20. In and/or on the main surface 10*a*, the optoelectronic or photonic element 50*i* of the respective optoelectronic or photonic chip 100*i* is located; its active area thus being provided at the main surface 10*a*. Whereas in FIGS. 12 and 13 and in the subsequent figures the optoelectronic or photonic element 50*i*, that is the active area, is depicted to be very small in order to graphically indicate its precise center position very clearly, in practice the lateral extension of the optoelectronic or photonic element 50*i* and of its active area may be much larger and may cover up to more than 80 percent of the main surface of the respective chip 100*i*.

Conventionally, as mentioned above with reference to FIG. 12, the fiber coupling alignment structure 5 or FCAS is designed to have standardized, uniform positions (at least along the directions x and z) and orientations of the reflection surfaces 8; 80 and of the fiber support regions 7, 70 which are based on the assumption that all of the optoelectronic or photonic elements 50*i* will be mounted at their predefined default positions or at least sufficiently close to their predefined default positions. In FIG. 13, the predefined default position is denoted with 90 and is shown as a dashed line. This default position 90 only varies by the y-coordinate for each of the chips 100*i* such that, along the y-direction, the center position of the corresponding chip 100*i* is aligned with the center position to the associated optical fiber 30*i* (or its end portion to be coupled to the fiber coupling alignment structure) and also aligned with the y-position of the associated reflection surface 80*i* and of the associated fiber support region 70*i*. Furthermore, conventional designs are further based on the assumption that the orientation of the individual chips 100*i* is uniform for all chips and is in sufficient alignment with the normal direction z and the two lateral directions x, y as predefined by the substrate surface 20*a* of the mounting substrate 20. Accordingly, in a conventional design the reflection surfaces and/or the fiber support regions are likewise arranged at standardized, uniform positions and orientations.

As illustrated in FIG. 13, however, the actual position of an exemplary, individual optoelectronic or photonic chip 100*i*, for instance of the first chip 100*a*, is likely to comprise a positional misalignment, such as a vertical misalignment 'Maz' (or generally 'Miz' for the respective chip 100*i* or simply 'i' rather than 'a'), along the normal direction z relative to the substrate surface 20*a* of the substrate 10. Accordingly, the individual chip 100*i* may be mounted at a slightly higher or lower position compared to the default position. Furthermore, a lateral misalignment 'Mix', or 'Max' for the first chip 100*a*, along the first lateral direction x may, for instance, exist compared to the predefined default position 90. Furthermore, a second lateral misalignment 'Miy' may exist relative to the predefined default position 90. As a consequence, the optoelectronic or photonic element 50; 50*i* on the respective chip 100*i* may be misaligned with respect to its default position. Besides such misalignments of the optoelectronic or photonic element 50*i* or chip 100*i*, orientational misalignments may occur as well. For instance, the normal direction n of the main surface 10*a* of the chip 100*i* and, in particular, of its active area or optoelectronic/photonic element 50*i*, may be slightly slanted or misoriented relative to the correct normal direction or vertical direction z as predefined of the main surface 20 of support substrate 20. Accordingly, the actual position of the respective individual chip 100*i* may include misorientations 'Miα', 'Miβ' and/or 'Miγ' around the main directions x, y, z or some of them; such as Maα, Maβ and/or Maγ for the first chip 100*a*.

However, in case of any misalignment of the actual positions of the optoelectronic or photonic chips 10; 100*i* relative to their uniform default position 90 as shown in FIG. 13, there is a risk of a deterioration in transmission performance, in particular in the percentage of light actually transmitted between one of or some of the chips 100*i* and their associated optical fibers 30*i*. In order to minimize such transmission losses, fiber coupling devices conventionally are improved to some extent by placing the uniformly shaped FCAS structure 5 in a comparatively optimum position relative to the plurality of the (for instance four) optoelectronic or photonic chips 100*i*, at which optimum position of the FCAS the coupling efficiency is at least acceptable for each of the four optoelectronic or photonic chips 100*i*. Thus the conventional design only allows to adjust the position of the fiber coupling alignment structure 5 with regard to the default or average position averaged over the positions of all optoelectronic or photonic chips 100*i*. In such a conventional design, there is no way of compensating the misalignments of individual optoelectronic or photonic chips 100*i* separately. As a consequence, at least for some of the plural optoelectronic or photonic chips 100*i* of the conventional fiber coupling device, a certain rate of reduction in the achievable transmission performance has to be tolerated, since with a plurality of four or another number of misaligned chips 100*i* at the same time provided on the mounting substrate, there is no way how the conventional, uniformly designed fiber coupling alignment structures FCAS or 5 may prevent deteriorations in the transmission performance for all of the chip-to-fiber-systems at the same time to an optimum level.

However, individual corrections are rendered possible by the embodiments of the fiber coupling devices shown in the present application. According to the embodiments of the present application, individual compensations are rendered feasible which allow to optimize the coupling efficiency for each of the four chip-to-fiber-systems individually.

Figure 14:
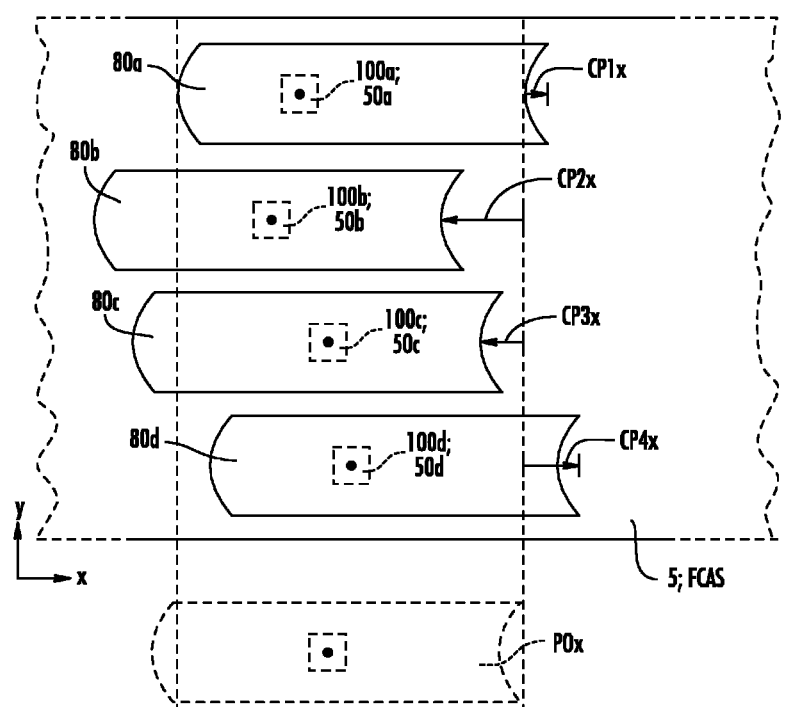
FIG. 14 shows an enlarged, partial top view schematically showing actual, individually offset positions of the reflection surfaces associated with the respective optoelectronic or photonic elements of FIG. 1, 5 to 10 or 12 according to an embodiment.

FIG. 14 shows an exemplary embodiment of the fiber coupling device 1 having a fiber coupling alignment structure FCAS or 5 having positional offsets of the individual reflection surfaces 8; 80 along the first lateral direction x parallel to the substrate surface of the mounting substrate. FIG. 14 only shows that portion or region of the fiber coupling alignment structure 5 in which the reflection surfaces 80*a*, 80*b*, 80*c*, 80*d* are located, they represent partial surfaces of the top surface of the FCAS which face away from the mounting substrate and which are either planar or curved. The reflection surfaces 80*a*, 80*b*, 80*c*, 80*d* may have edges around them by which they are confined, and they usually have lateral dimensions larger than and encircling those of the respective chip 100*i* underneath. Beneath the reflection surfaces 80*a*, 80*b*, 80*c*, 80*d* or 80*i* (with i=a, b, c, d), the optoelectronic or photonic chips 100*i* carrying the optoelectronic or photonic elements 50*i* are shown in FIG. 14; they are arranged on the substrate surface as already illustrated in FIGS. 1 and 5 to 10 as well as in FIG. 12. In the conventional design of FIG. 12, the lateral position of all associated reflection surfaces 80*a*, 80*b*, 80*c*, 80*d* is identical; thus it is the same for all reflection surfaces 80*a*, 80*b*, 80*c*, 80*d* and for instance corresponds, along the direction x, to a default position POx (shown at the bottom of FIG. 14 in dashed lines) which represents a uniform x-position. Conventionally, the uniform reflection surface position is maintained, regardless of how precisely and how closely the associated chips 100$i$ are placed near their default position 90 shown in FIG. 13.

In the embodiment shown in FIG. 14, the actual position of the reflection surface 80$i$ varies individually for each individual reflection surface 80$i$, that is 80$a$, 80$b$, 80$c$ and 80$d$. Thereby, individual misalignments of the respective optoelectronic or photonic chips 100$i$ are compensated for. In particular, in order to compensate for misalignments such as those indicated in FIG. 13, compensational offsets, such as positional offsets of the reflective surfaces 80$i$, may be provided. At least some of the offsets discussed herein below may even be realized when using conventional techniques, such as stamping or overmolding. Beyond that, in case of applying 3D lithography such as laser scanning or holography, for instance, a still wider variety of individually calculated compensational offsets such as those explained with reference to FIGS. 14 to 20 are rendered feasible. To this end, the three-dimensional shape of the region or portion of polymerizable material to be converted into the polymer material is calculated and designed such that the respective reflection surfaces and/or fiber support regions associated with the individual optoelectronic and/or photonic elements will be arranged at their individually calculated offset position and/or offset orientation and/or with their predefined offset in shape, which may be a parameter-related offset of a parameter defining the shape of the reflection surface (see further below). Such kinds of offsets described now with reference to FIGS. 14 to 20 may also be combined with one another.

In the example of FIG. 14, individual compensational positional offsets CPi$x$ (with i=a, b, c, d) are proposed for the respective reflection surfaces 80$i$ associated with the corresponding optoelectronic and/or photonic chip 100$i$ underneath. As apparent from FIG. 14, the first reflection surface 80$a$ is shifted, along positive direction x, by a positional offset CP1$x$ relative to the default x-position P0$x$. For the second reflection surface 80$b$, there is a negative offset CP2$x$ along negative x-direction. Likewise, the third reflection surface 80$c$ is positionally offset by a smaller amount along negative x-direction (CP3$x$), whereas the fourth reflection surface 80$d$ is offset along positive x-direction by an offset CP4$x$ larger than that of the first reflection surface 80$a$. These offsets are realized by designing the shape the fiber coupling alignment structure FCAS or 5 such that each reflection surface 80$i$ is positioned at its individually shifted offset position, thereby compensating or at least helping compensate the misalignments of the chips 100$i$, such as those explained above with reference to FIG. 13. By the way, in FIGS. 14 to 20, the positional, rotational and parameter-related offsets are shown in exaggerated size for clearer illustration in the drawings.

Figure 15:
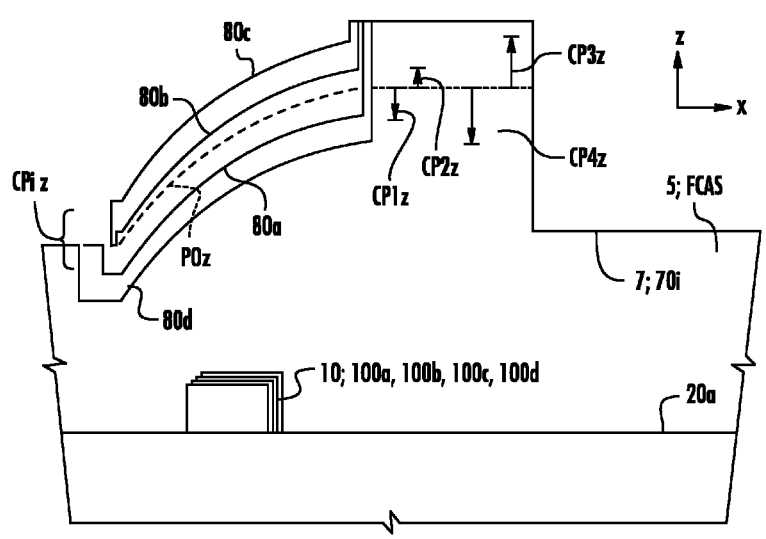
FIG. 15 shows a schematical side view illustrating compensational positional offsets of the reflection surfaces in vertical, that is normal direction according to another embodiment.

FIG. 15 shows another embodiment which may be realized separately or in combination with further embodiments, for instance those of FIG. 14 and/or any of FIGS. 16 to 20. According to FIG. 15, vertical compensational offsets CP1$z$ along the normal direction n (FIG. 5) or z of the substrate surface 20$a$ are realized for the reflection surfaces 80$i$. As an example, the compensational positional offsets CP1$z$ and CP4$z$ of the first and fourth reflection surface 80$a$ and 80$d$ may be negative, that is along negative z-direction towards the substrate surface 20$a$, whereas, in this example, the vertical offsets CP2$z$ and CP3$z$ of the second and third reflection surface 80$b$, 80$c$ may be positive. As in FIG. 14, the positional offsets in FIG. 15 may be chosen individually.

Thus, the amount and the direction (positive or negative z-direction) may be chosen individually for each of the reflection surfaces 80$a$ through 80$d$. The individual vertical offsets CPi$z$ likewise compensate or help compensate the misalignments of the chips 100$i$ or 100$a$, . . . , 100$d$ underneath.

Alternatively or in combination with FIGS. 14 and/or 15, also along the second lateral direction y, corresponding positional offsets CPi$y$, that is CP1$y$, CP2$y$, CP3$y$ and CP4$y$, may be realized relative to respective reference positions P1$y$, P2$y$, P3$y$ and P4$y$ defined by the default position of the respective chip 100$i$ (not illustrated). Accordingly, the pitch distance and/or width of the reflection surface 80$i$ along y-direction need no longer be chosen uniformly.

The positional offsets Cpi$x$, CPi$y$ and/or CPi$z$ may, for instance, be calculated and realized individually for each reflection surface 80$a$, 80$b$, 80$c$, 80$d$ of the FCAS in order to compensate for different lengths or distances of the optical fiber end portions 31 to be coupled to the chips 100$i$. For instance, in case that an individual optical fiber 30$i$ is comparatively short, the position of the associated reflection surface 100$i$ may be lowered along negative z-direction by a compensational offset CPi$z$, such as CP4$z$ as shown in FIG. 15. Likewise or in addition, compensational lateral offsets CPi$z$ along positive x-direction as shown in FIG. 14 may be realized for the respective reflection surface 80$i$. Of course, both offsets along the directions x and z may be combined. Further offsets may be applied for compensating positional and/or orientational offsets of the corresponding chips 100$i$ underneath.

Figure 16:
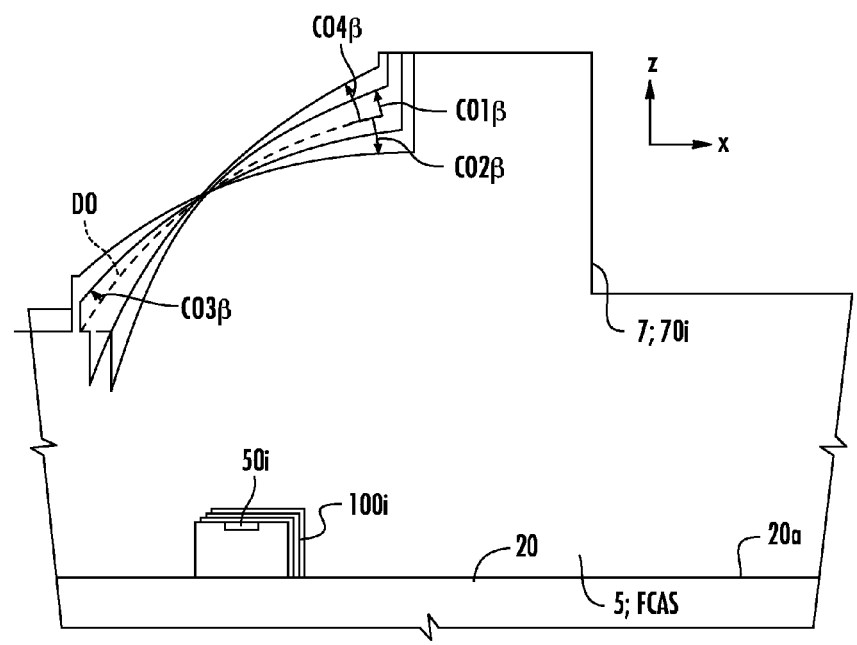
FIG. 16 shows a further embodiment of a fiber coupling device with compensational, orientational offsets of the reflection surfaces.

FIG. 16 shows an embodiment in which orientational, that is rotational offsets or tilts, are realized for the corresponding reflection surface 80$i$; 80$a$, . . . , 80$d$, for instance a rotational offset or tilt angle around the second lateral direction y by a respective tilt angle or rotation angle β. Such tilt angle may, for instance, represent tilt angles of individual reflection mirrors, that is reflection surfaces 80$i$, around their center point or another reference point, especially around a center point having the same xy-position as the default xy-position originally defined for the corresponding optoelectronic and/or photonic element 50$i$ underneath. In the example of FIG. 16, the first and fourth reflection surface 80$a$, 80$d$ are compensationally rotated, by respective angles β, in counter-clockwise direction compared to a default orientation D0, around the y-direction (that is by the compensational orientational offsets 'CO1β' and 'CO4β'), whereas the rotational offsets 'CO2β' and 'CO3β' for the second and third reflection surface 80$b$, 80$c$ are in clockwise direction in the example of FIG. 16.

Likewise, although not shown in FIG. 16, compensational orientational offsets, that is reflection surface rotations COi$α$; COa$α$, . . . CO$d$α (not shown) around the x-direction and/or orientational offsets COi$γ$; CO1$γ$, . . . CO$d$γ (not shown) around the z-direction may be realized for the reflection surfaces 80$i$; 80$a$, . . . , 80$d$ or some of them. Again, these or some of these orientational reflection surface offsets may be combined with the positional offsets addressed with reference to FIGS. 14 and/or 15.

Figure 17:
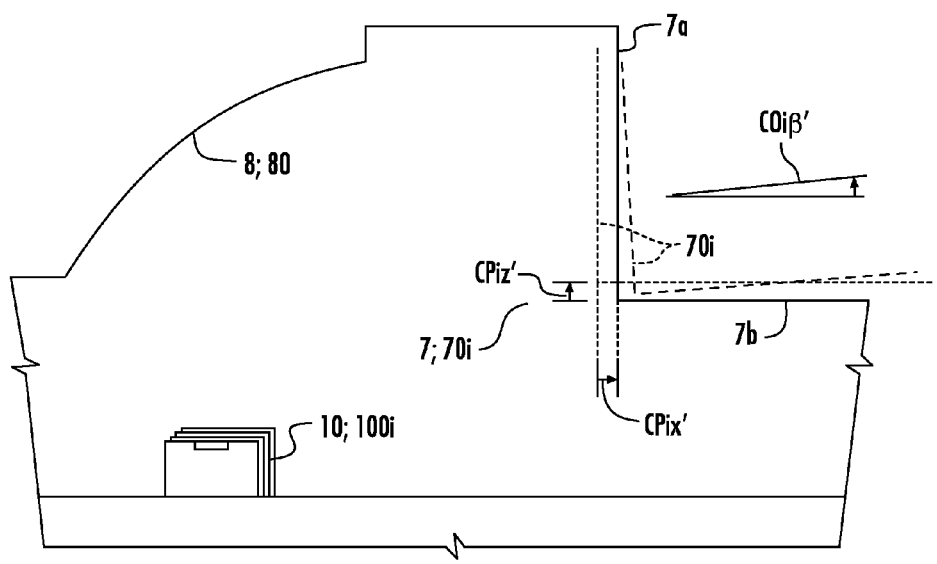
FIG. 17 shows a further embodiment of a fiber coupling device whose fiber coupling alignment structures comprise positional and/or orientational offsets of the fiber support regions.

FIG. 17 shows a further example in which individual compensational offsets of the fiber coupling regions 70$i$; 70$a$, . . . , 70$d$ (FIG. 12) rather than offsets of the reflection surfaces 80$i$ are realized. In the example of FIG. 17, positional offsets CPi', in particular along the directions x and z, that is CPi$x$' and/or CPi$z$' of the respective fiber coupling region 70$i$ are shown. Accordingly, the positions of the individual optical fiber end portions, when finally coupled to the fiber coupling device 1, may be different in the xz-plane and may differ from one another and/or from a default position as conventionally adopted for all four fiber coupling portions. In FIG. 17, for instance, lateral positional offsets CPix' along x-direction and/or CPiz' along z-direction (and, of course, CPiy along y-direction, but not shown) may be realized, thus arriving at individually shifted positions of the corresponding positions of the respective coupling surfaces 7a and/or fiber support surfaces 7b of the respective one of the plural fiber support regions 70i or 70a, ..., 70d. Likewise, orientational offsets of the individual fiber support regions 70i may be realized in addition or alternatively. For instance, an individual fiber support surface 70i, that is the U-groove or V-groove for the respective optical fiber 30i, may have a rotational offset COiβ' by a tilt angle β' around the y-direction. Although not shown for all three rotational axes, corresponding rotational offsets COiα', COiβ', COiγ' around any axis may be realized. Of course, like in FIG. 16 the rotational angles may be chosen to be individual for each one of the reflection surfaces 80i and/or of the fiber support regions 70i.

Also for the fiber support regions 70i or 70a, ..., 70d, positional and orientational offsets of the fiber support regions may be combined with one another. Further, they may be combined with positional and/or orientational offsets of the reflection surfaces 80i, such as those described with reference to FIGS. 14 to 16. Any combination of these offsets may be chosen. For instance, vertical offsets CPiz of the reflection surfaces 80i and vertical and/or lateral positional offsets CPiz', CPix' of the fiber support regions 70i may be combined. As a further example, orientational offsets COiβ of the reflection surfaces 80i and positional and/or orientational offsets COiβ' (around y-direction), CPiz', CPix' of the fiber coupling regions 70i may be combined.

By the way, although not explicitly mentioned, of course one fiber coupling alignment structure 5 or FCAS may suffice for enclosing all of the plural optoelectronic or photonic chips 100i on the mounting substrate 20. Alternatively, plural or separate FCAS structures 5 might be formed, each enclosing one or some of these chips. However, preferably all, especially all four chips are enclosed and coupled by one and the same FCAS structure, as illustrated throughout the application.

Whereas FIGS. 14 to 17 illustrate positional and rotational offsets of the reflection surfaces and/or fiber support regions, there are further compensational offsets perceivable at least for the reflection surfaces. In particular, parametrical offsets concerning parameter values defining the shape and/or contour of the individual reflection surfaces may be defined and offset, thus altering the shape of the respective reflection surface 80i compared to a uniform default shape or another kind of reference shape. Such parameter-related offsets or distortions as described below may further be combined with the positional and/or rotational offsets discussed above. By such parametrical offsets varying the shape of the individual reflection surfaces, the reflection surface may, for instance, be shaped wider, narrower or otherwise distorted compared to a default or reference shape of the reflection surfaces. For instance, the values of parameters, such as polynomial coefficients defining the reflection surface's shape, may be offset, that is altered compared to an initial default value, thereby arriving at individually adjusted reflection surface shapes of each respective individual reflection surface 80i.

The reflection surfaces may, for instance, be shaped according to polynomial equations mathematically defining the precise shape or contour of each individual reflection surface. The compensational offsets for compensating the chip misalignments may, for instance, be distortions of each respective reflection surface. Such distortions may be distortions which are defined by parameter values occurring in the polynomial equation of the respective reflection surface or by offsets of these or one or some of these parameter values. For instance, a shift of a particular polynomial coefficient or parameter may alter the respective polynomial reflection surface 80i to be narrower or wider along the particular direction, to have a larger or smaller radius of curvature along a particular direction or in a particular sectional line, to be tilted or otherwise distorted in a particular direction or within a particular sectional plane. Furthermore, there may be parameters whose values are chosen or offset such that a certain degree of astigmatism, conic distortion (in particular biconic distortion along two directions) or other kinds of distortions or warpings are imparted to the respective reflection surface 80i.

As an example of such polynomial surfaces representing the individually adjusted reflection surfaces 80i, for instance, Zernike surfaces and in particular biconic Zernike surfaces may be used.

Figure 18:
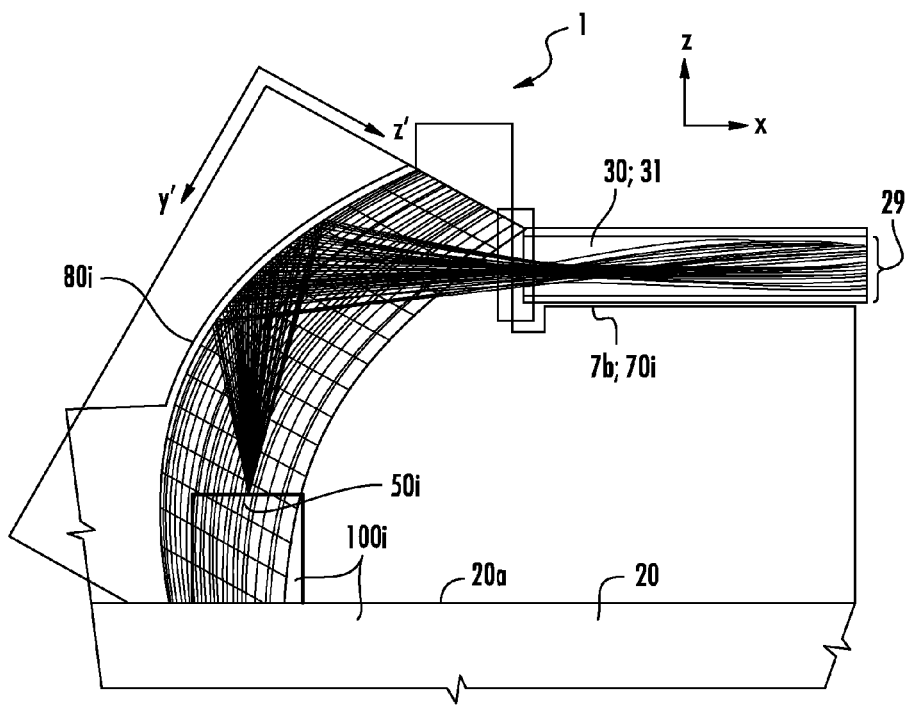
FIG. 18 shows a cross-sectional view of an embodiment regarding the shape of the reflection surfaces of a light-emitting fiber coupling device to be formed.
Figure 19:
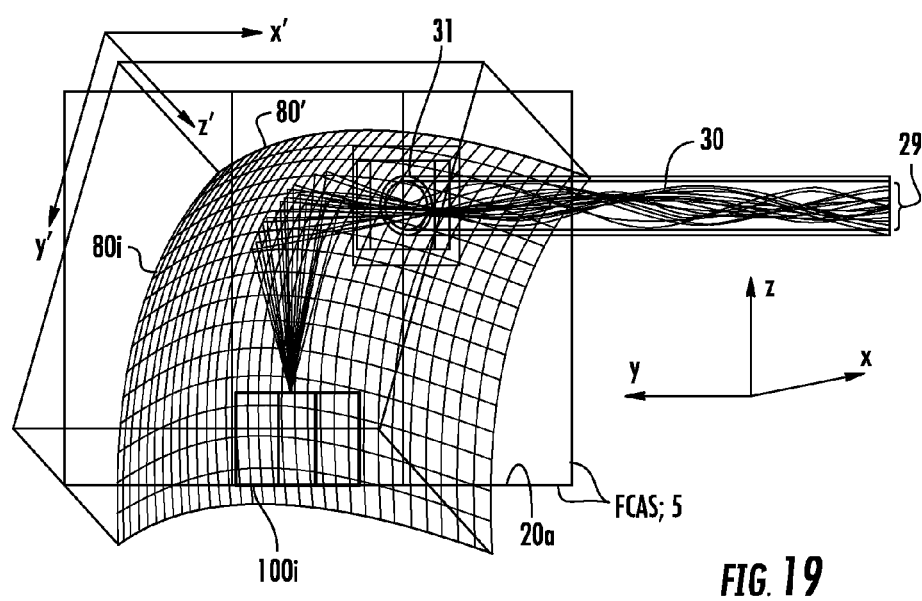
FIG. 19 shows a perspective view of the embodiment of FIG. 18.
Figure 20:
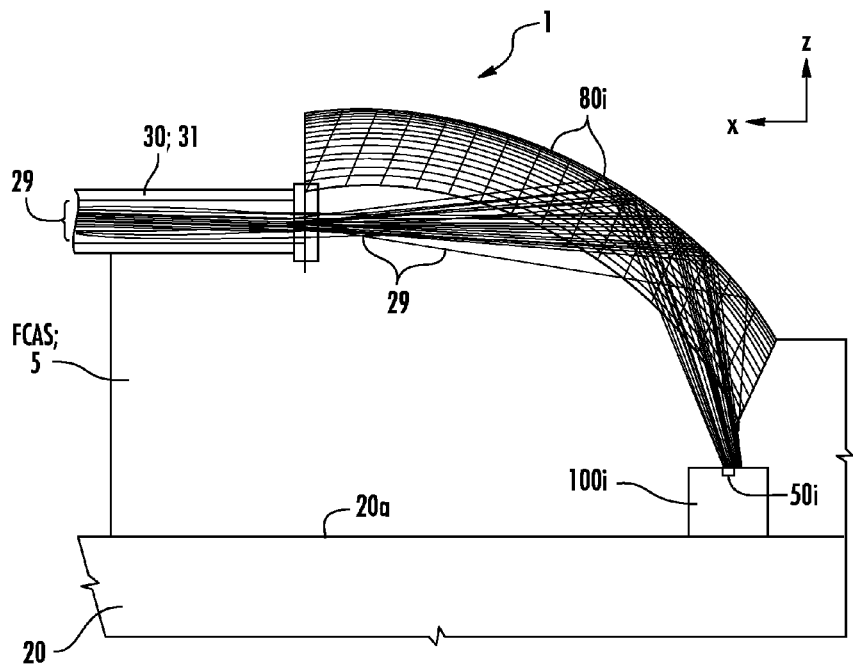
FIG. 20 shows an exemplary embodiment regarding the shape of the reflection surfaces of a light-receiving fiber coupling device.

FIGS. 18 to 20 illustrate some exemplary embodiments in which polynomial surfaces, for instance Zernike lens surfaces are used as reflection surfaces 80i of the fiber coupling device. FIG. 18 shows a sectional side view in which the shape of a biconic Zernike reflection surface 80i is indicated by a grid structure indicating, in addition to the curvature within the xz-plane, the shape along the second lateral direction y, that is perpendicular to the drawing plane. For illustration of the biconic surface profile, the area of the grid pattern representing the biconic Zernike surface is depicted larger than actually used for the reflection surface of the fiber coupling alignment structure 5; the partial area actually used for the reflection surface is denoted with 80i; in the drawing this line is shifted, only for the purpose of illustration, to the left for clearer distinction from the overly dimensioned, explanatory grid pattern.

In FIG. 18, the optical fiber 30 or its end portion 31 is, for instance, mounted at a vertical distance of 620 µm above a substrate surface 20a, that is above the bottom surface of the FCAS structure 5. The vertical position of the optoelectronic or photonic element 50i of the chip 100i is 150 µm above the substrate surface, for instance. The shape of the reflection surface, as defined by the polynomial constants or coefficients, may be different along at least two sectional planes or directions along the respective Zernike surface 80i. As apparent from the side view shown in FIG. 18, the reflection surface 80i may tilted and/or shifted by any shift vector and/or or set of tilt angles. Furthermore, each reflection surface may individually be distorted or warped, that is parametrically offset.

From the exemplary embodiment of FIG. 18 showing a Zernike surface 80i as one of the reflection surfaces, it appears that there is a conic component rather than a constant radius in the sectional xz-plane, thus distorting the polynomial reflection surface compared to conventional, spherical surfaces. Generally any kind of aspherical reflection surfaces other than Zernike surfaces may likewise be adopted for shaping the reflection surfaces 80i.

As regards shift and/or tilt offsets, FIG. 18 shows a tilt of the reflection surface around its center point as well as a shift relative to the center point of the Zernike reflection surface relative to the center region of the beam of light 29 emitted from the chip 100i and reflected to the end portion 31 of the optical fiber 30. Along the directions x and y (or two different, tilted reference directions), two different radii of curvature and conic constants exist, especially in the center point, but also at the point of the reflection surface where the center line of the beam of light is reflected. Furthermore, a plurality of, for instance, six Zernike parameters or Zernike polynomial coefficients may be defined individually for each of the reflection surfaces 80a through 80d; at least these plural Zernike parameters are non-zero.

FIG. 19 shows a perspective view of the FCAS structure 5 of FIG. 18, seen from an inclined direction within the xy-plane. In FIG. 19, the shape of the reflection surface 80i in the three-dimensional space, in particular in the direction perpendicular to the xz-plane of FIG. 18, is depicted more clearly. Furthermore, a tilted coordinate system is shown whose coordinate directions x', y', z' are parallel to the main directions of the tilted and/or shifted reflection surface. Inter alia, in the tilted orientation, the entire Zernike surface is facing positive x-direction, but negative z-direction. A section of the surface area of this Zernike surface is used as the partial surface representing a respective reflection surface 80i at the upper side of the FCAS structure 5, as illustrated in FIG. 18. The embodiment of FIGS. 18 and 19 has been optimized for light-emitting optoelectronic or photonic elements 100i, particularly for VSCELs.

Generally, after having measured the misalignments of the individual chips, the optimization process may start with a reflection surface of initially uniform, non-distorted shape for all chips 100i. In a first optimization step, one or a plurality of surface parameters, such as polynomial constants, may be offset, that is altered, thereby obtaining a first variation of the reflection surface associated with the respective chip 100i. The coupling efficiency, that is the ratio or percentage of light transmitted due to the respective variation of the reflection surface's shape, may then be calculated for each reflection surface, and may be compared with the coupling efficiency achievable due to the initial, uniformly pre-selected shape. Thereafter, a second variation of the reflection surface's shape based on different numerical values or offsets of the same and/or further parameters (particularly surface parameters such as the polynomial coefficients) may be defined, thereby obtaining the second variation of the individual shape of the respective reflection surface 80i. The coupling efficiency obtainable by this second variation of the reflection surface is then calculated. The values of the parameters or coefficients and/or their offsets from their initially predefined numerical values may be refined and tailored until the maximum achievable amount of coupling efficiency is reached in the calculation for each reflection mirror. Since the chip misalignments are different for each chip, also the set of parameters or coefficients defining the optimum shape of the respective reflection surface will be different for each one of the reflection surfaces 80i. However, each reflection surface whose shape is defined thereby will ideally compensate the particular misalignments of the associated chip 100i underneath. For instance, in case of VSDN fibers (Very Short Distance Network fibers) with a cladding diameter of 100 μm and a core diameter of 80 μm, a coupling efficiency of up to about 99.77% for each chip 100i is achievable. The number of iteratively performed variations, that is calculations for optimizing the shape of the reflection mirror 80i, may be chosen depending on the degree of coupling efficiency percentage already achieved, for instance due to a minimum value of coupling efficiency required. By the way, the iterational calculation of the optimum reflection surface shape may be performed for each reflection surface separately. In the same way, positional and/or rotational offsets, that is shifts and/or tilts, may likewise be optimized by repeatedly and iteratively predefining positional and/or rotational offset values and/or corresponding variations of the offset surfaces of the reflection surfaces and/or fiber coupling regions, based on which the coupling efficiency is calculated and compared. Furthermore, in each iterative step, combined positional, rotational and/or distortional offsets may be predefined and/or optimized.

Whereas FIGS. 18 and 19 show an exemplary embodiment in which the shape of the reflection surfaces has been optimized for a plurality of light-emitting optoelectronic elements, FIG. 20 shows another embodiment in which the optoelectronic elements of the chips 100i are photo diodes. The light of the light beam 29 exits the end portion 31 of the optical fiber 30, is reflected by the parametrically optimized reflection surface 80i and is then received by the respective optoelectronic element 50i or photo diode of the respective chip 100i. Again, the reflection surfaces 80i may be chosen to be Zernike lens surfaces or other kinds of polynomial or aspheric surfaces, for instance. The polynomial coefficients or further parameters (such as shifts or tilts) of the reflection surfaces 80i are varied, iteratively optimized and finally selected such that the maximum achievable percentage of the respective light beam reception by the respective photo diode is obtained. By individually adjusting the coefficients defining the position, orientation, distortion and overall shape of the respective reflection surface 80i, the misalignment of each chip 100i is compensated. In case that Zernike surfaces are used for the reflection surfaces, such as those of FIGS. 18 to 20, as exemplary distortions in particular defocus, astigmatism, conic or biconic curvature, and/or coma may be realized.

A very precise fabrication of a FCAS structure 5 comprising the individually adjusted reflection surfaces 80i and/or fiber support regions 70i, as described hereinabove with reference to FIGS. 1 to 20, can be obtained by monitoring the polymerization process on the real-time basis, especially when 3D lithography methods are applied, such as 3D laser scanning or dynamic holographic lithography. Both methods are contactless and maskless and allow direct control of the progress of the polymerization process for shaping the FCAS structure 5. Especially when 3D laser scanning is applied, in-situ monitoring of the progressively polymerized FCAS structure 5 is possible, in the process of which any deviation of the actually converted, that is polymerized polymer region might be about to deviate, in particular to expand beyond the optimum final, outer shape resulting from the calculation based on the compensational, individual offsets. As soon as any deviation, that is undesired shift from the correct FCAS shape is observed via the vision system, the further track of the laser focal region and/or its reference position relative to a predefined reference point, to the element 50i or to any other component of the device or of the lithography tool may be corrected instantly. Thus any evolving deviation of the shape compared to the formerly calculated final, outer surface shapes of the reflection surfaces and/or fiber support regions may be detected with almost no time lag, thus enabling immediate correction of the current position of the laser beam, especially of its focal region.

For clarity, it is to be noted that, on the one hand, there are individual offsets previously discussed with reference to FIGS. 1 to 20 and particularly FIGS. 12 to 20; these offsets are intentionally realized for the purpose of compensating measured misalignments of the individual optoelectronic or photonic chips relative to the support substrate. The positional, rotational and/or parameter-related offsets of the reflection surfaces and/or fiber support regions are thus intentionally defined, desired offsets; with each reflection surface or fiber coupling region being supposed to be positioned according to its individually calculated offset or set of offsets. On the other hand, in contrast to the above desired and purposefully provided offsets, there may be unintentional, undesired misadjustments, such as the measured chip misalignments themselves, but also fabrication tolerances of the fabrication process, such as misadjustments of the lithography tool. The visual system described below with reference to FIG. 21 may be used to detect, measure and thereby in-situ compensate or even eliminate these undesired misalignments and/or misadjustments. For instance, there may be misalignments of the individual chips 100$i$ with reference to the support surface 20$a$ of the support substrate. Furthermore, there may be misadjustments of the manufacturing tool used for triggering polymerization, such as a 3D laser scanning system as addressed with reference to FIG. 3 or 11. Measuring and compensating adverse misalignments will help to precisely fabricate the calculated shape of the FCAS structure 5, including its intentionally offsets of the upper partial surfaces, especially the reflection surfaces 80$i$ and/or fiber support regions 70$i$ associated with the respective optoelectronic or photonic chip 100$i$ enclosed by the polymerized material.

Figure 21:
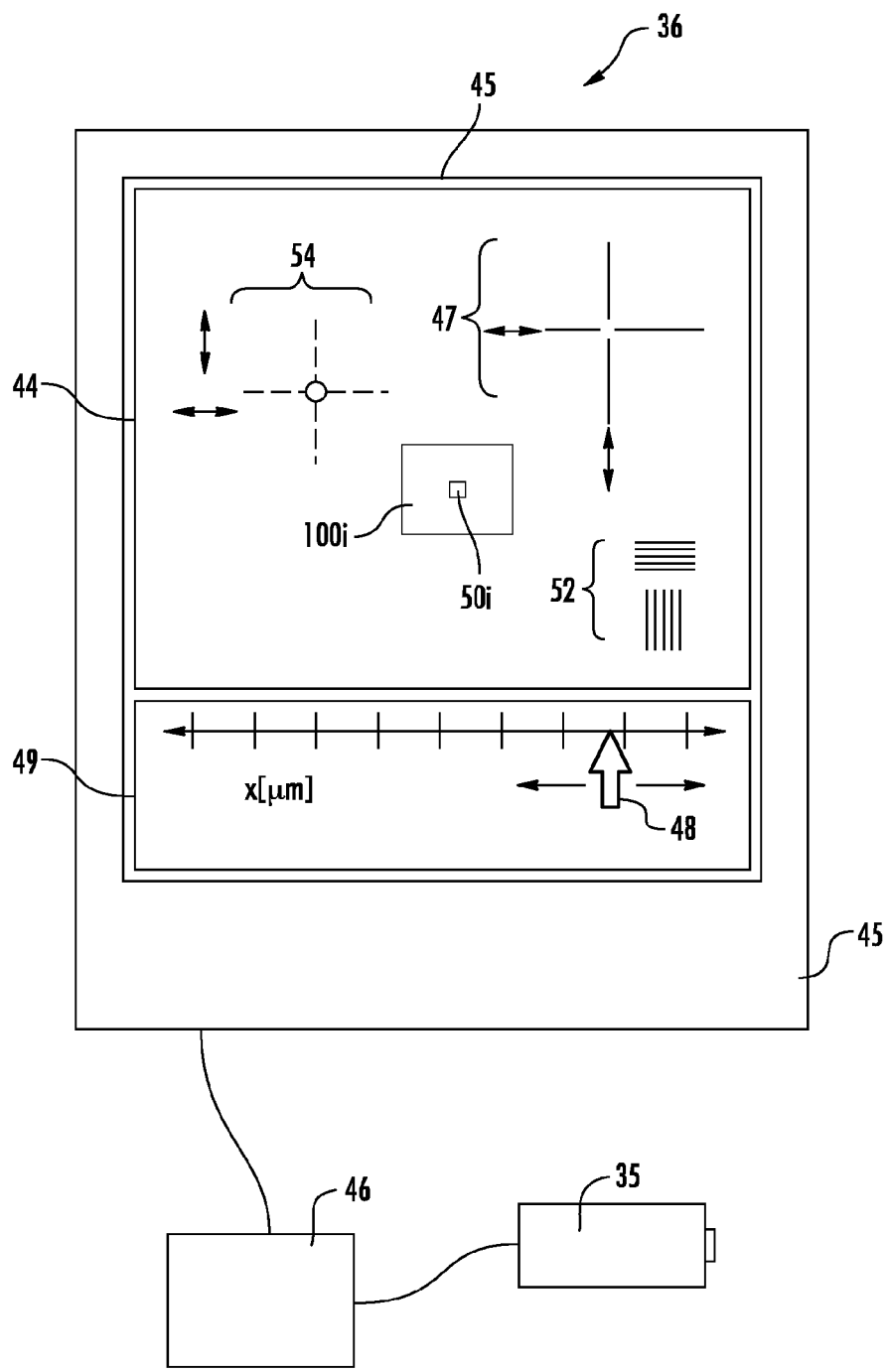
FIG. 21 schematically shows an exemplary embodiment of a visual system for executing real-time monitoring of the fiber coupling alignment structure during manufacture.

FIG. 21 shows an exemplary embodiment of a visual system 36 for enabling precise carving or shaping of the reflection surfaces and/or fiber support regions, for instance, especially when a 3D lithography technique such as 3D laser scanning is applied. The visual system 36 may comprise, in addition to the camera 35 of FIG. 11, a visual system control unit 46 and a display 45 for displaying a real-time image of the substrate surface and/or the polymerizable and/or polymerized material covering it. In the example of FIG. 21, the display 45 shows, in an upper portion thereof, the real-time image 44 allowing in-situ monitoring of the polymerizable material on the substrate surface and, of course, observing the optoelectronic or photonic chips 100$i$ arranged on it. For instance, a part of the substrate surface may be monitored in which one of the plural chips 100$i$ is mounted. The substrate surface 20$a$ and/or the chip's top surface may comprise reference structures 52 for adjusting the visual system 36 and/or the laser beam 40 (FIG. 11), especially in the two lateral directions; The reference structures 52 may define a reference point in one or two directions. In the upper window 44 of the display 45, a real-time image of the chip 100$i$ and/or of its optoelectronic or photonic element 50$i$ is displayed for monitoring the FCAS shaping process in-situ. The displayed real-time image 44 may be overlapped by a laser focal point marker 54 also visible within the window 44, thereby marking the current lateral and/or vertical location of the focal region of the laser beam in which, due to two-photon-polymerization, polymerization will take place or already is about to take place selectively. The laser focal point marker 54 may be moved automatically in the display window 44 in correspondence with the course or track of the laser beam over time.

In a lower portion or window of the display 45, a reference image 49 may be shown, such as a computer image or graphical image allowing detection, measurement and/or compensation of alignments or misalignments of the chip relative to the substrate, of the laser relative to the chip, the substrate or to any other reference point on the substrate or within the upper window or another, second window or partial display.

For instance, a micrometer scale or another position scale may be displayed as a reference image 49 in another window such as the lower partial image of the display 45. In addition, a default position marker 48 may be displayed for identifying a default position of the laser beam, or of the optoelectronic or photonic element or of any other part of the monitored fiber coupling device 1, along at least one direction x, preferably along two lateral directions and/or along the vertical direction perpendicular to the substrate surface 20$a$. The real-time image 44 and the reference image 49 preferably are displayed simultaneously in the display 45 ahead of and/or during the process of laser scanning. By the way, both images 44, 49 may be displayed in an overlapping view in a single window or window area. Furthermore, as mentioned above, the real-time image 44 may be overlapped by movable markers, such as the laser focal point marker 54 or the actual position marker 47. The actual position marker 47 may, for instance, be moved at least in two lateral positions and may, for instance, be aligned with the center of the optoelectronic or photonic element 50$i$ on the chip 100$i$. The position marker 47 may, for instance, be manually aligned so as to hit the position of the element 50$i$ in the real-time image 44. The visual system control unit 46 will then automatically align this actual position with the default position identified by the default position marker 48 in the reference image 49. Alternatively, the control unit might calculate the distance, shift or alignment vector between the position of the element 50$i$ (or any other reference position or reference element displayed in the real-time image 44, such as the reference structures 52, for instance) and the default position identified by the default position marker 48. The alignment vector is taken into account when calculating and/or guiding the laser beam across the volume of polymerizable material, thereby ensuring that any undesired misadjustments inherent to the laser scanning system and/or other deviations or misalignments of the calculated positions or the intentional offsets of the individual surface regions (especially the individual reflection surfaces 80$i$ and fiber support regions 70$i$) are compensated, thereby shaping the partial volume of solidified polymer material in the surrounding liquid polymerizable material precisely according to the desired shape. Apart from the exemplary embodiments discussed above, there may be several further embodiments of a visual system for monitoring the growth of the FCAS structure 5.

Especially 3D lithography techniques will profit from in-situ monitoring of the substrate surface. Thereby, the comparatively small offsets of the reflection surfaces and/or fiber coupling regions may be designed in precise conformity with the results of the calculation executed based on the measured misalignments of the chips. The calculation for determining the designed positional, rotational and/or coefficient-related offsets of the partial surfaces of the FCAS structure 5 may be executed prior to and/or during the process of laser scanning.

The application of the visual system for shaping individual offsets of the reflection surfaces and/or fiber coupling regions, however, can not only be exploited in case of adopting 3D laser scanning or generally 3D lithography techniques. Beyond that, even conventional polymerization techniques such as stamping or molding, especially overmolding, may benefit from visual monitoring. For instance, instead of 3D lithography, a stamping or overmolding process may be used in which a mold or die defining the shape of a partial surface is positioned above the substrate. For instance, a plurality of for instance four reflection surface dies or moulds may be positioned at individually offset positions with respect to uniform positions (for instance, at identical x- and z coordinates and with a constant pitch distance along the y-coordinate) predefined above all the four chips 100$i$. Although each die will have the same shape which cannot be varied by distortional offsets, nonetheless at least the positional offsets, that is shifts along arbitrary directions, as well as rotational offsets, such as tilts around any direction, may be realized by repositioning the respective dies, especially those for the reflection surfaces for the respective chip 100*i*. With a multi-die stamp or mould having the individually movable and thus individually offset dies, a tailored FCAS structure 5 may be formed by pressing this stamp on top of a polymerizable material prior to and/or during polymerization. When the stamp is in its final position, polymerization may, for instance, be triggered by UV-radiation, thereby turning the polymerizable material into the polymer material, thus hardening and shaping the FCAS structure 5 having individually offset reflection surfaces and/or fiber support regions. By applying overmolding, the FCAS structure 5 is thus formed between the stamp or die and the support substrate. Accordingly, even conventional techniques of shaping the FCAS structure 5 may be applied for realizing individual compensational offsets.

By measuring chip misalignments and calculating individual offsets for compensating such misalignments, any FCAS structure 5 may be improved, thus arriving at fiber coupling devices 1 with increased coupling efficiency. In particular, any method of independent claims 1 and 24 or of the dependent claims may be applied for manufacturing improved fiber coupling devices.

Figure 22:
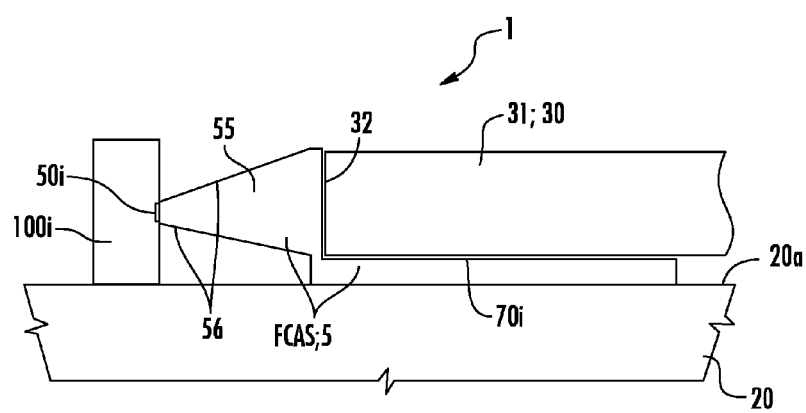
FIG. 22 shows a first embodiment of a fiber coupling device which comprises at least one concentrator.

Furthermore, various embodiments of improved fiber coupling devices may be manufactured thereby. For instance, in addition to FIGS. 1 and 5 to 10 as well as 12 to 20, FIG. 22 shows a further embodiment of a fiber coupling device in which concentrators 55 rather than optically projecting reflection surfaces are formed as partial surfaces of the FCAS structure 5. According to FIG. 22, a fiber coupling device 1 with plural, for instance four optoelectronic and/or photonic elements 50*i* or 50*a* to 50*d* is formed. In FIG. 22, the elements 50*i* may, for instance, be mounted with their side surface at the substrate surface 20*a* of the substrate 20. Accordingly, the main surface of each respective chip 100*i* comprising the optoelectronic or photonic element 50*i* is facing the end portion 31 of the optical fiber 30. Again, like in FIGS. 1 to 20, a polymer structure is shaped by selectively polymerizing the polymerizable material (FIGS. 2 to 4). However, the surfaces to be adjusted or offset individually for compensating eventual misalignments of the individual elements 50*i* or chips 100*i* here are the conical or otherwise tapering circumferential surfaces of the concentrators 55; they have to be shaped very precisely in accordance with potential misalignments of the optoelectronic and/or photonic elements 50*i*. The circumferential surfaces serve as guiding surfaces 56 for narrowing the light beam diameter when exiting the optical fiber end portion 31 and approaching the optoelectronic or photonic element 50*i*. In contrast to optical elements such as lenses or reflection surfaces, a concentrator 55 or its guiding surface 56 does not optically project the light beam. However, it guides and thus focuses or concentrates the light beam on its path from the optical fiber 30 to the active area of the element 50*i*. As in FIG. 8, upon application of a technique such as 3D lithography, the shaped FCAS structure 5 may bridge certain regions of the substrate surface 20*a* between the fiber coupling regions 70*i* and the optoelectronic chips 100*i*. In particular, in FIG. 22, each concentrator 55 and its guiding surface 56 (which is supposed to be conical or at least narrowing or converging with decreasing distance from the element 50*i*) may be spaced apart from the substrate surface 20*a*. On the main surface of the chip 100*i*, however, the concentrator 55 formed of the polymer material is in direct contact with the optoelectronic or photonic element 50*i*. On the opposite end facing the optical fiber 30, the concentrator 55 may contact the fiber end surface 32 or, alternatively, may be separated from it by a narrow air gap or glue layer. Apart from this, the fiber support region 70*i*, as in the previous figures, at least comprises fiber support surfaces, including V- or U-grooves, for instance.

By means of the methods described in the instant application, a fiber coupling device is provided which comprises a substrate, the substrate having a substrate surface and at least one optoelectronic and/or photonic element, and which device further comprises at least one fiber coupling alignment structure that is arranged on the substrate surface of the substrate and that is optically transmissive. The at least one fiber coupling alignment structure is made of a polymer material and comprises a support interface surface at which the polymer material is in direct contact with the substrate surface of the substrate; a fiber support region supporting or being adapted to support at least one optical fiber in an aligned position for optical coupling to the substrate; and/or a reflection surface for reflecting light propagating between an optical fiber and the substrate. The substrate and the fiber coupling alignment structure of the fiber coupling device form an integral part which is free of adhesive or any other material between the polymer material of the fiber coupling alignment structure and the substrate surface of the substrate. The substrate is an optoelectronic or photonic chip that comprises at least one optoelectronic or photonic element. The substrate may also comprise a mounting substrate and at least one optoelectronic or photonic chip arranged on the mounting substrate, wherein the at least one optoelectronic or photonic chip comprises the at least one optoelectronic or photonic element. The polymer material of the fiber coupling alignment structure may conform to and directly adjoin, without any gap or layer in between, a main surface of the chip, at least two sidewalls of the chip and at least a portion of a main surface of the mounting substrate. For instance, the polymer material of the fiber coupling alignment structure may conform to at least one portion of a main surface of the mounting substrate and may bridge over the at least one chip without contacting the chip. The fiber coupling device may further comprise at least one optical fiber which is supported, with its axial direction inclined by more than 45° relative to a normal direction of the main surface of the substrate, by the fiber support region. In particular, a fiber coupling device of any one of claims 31 to 33 may comprise any combination of features discussed herein above.

So far, whenever reflection surfaces have been addressed above in the specification with respect to the figures, reflection surfaces serving to change the overall propagation direction of the light beam have been depicted in the figures. However, the methods and fiber coupling devices as presented in the claims likewise cover embodiments in which reflection surfaces serve to narrow the diameter, that is the cross-section of the respective light beam, preferably without changing its overall propagation direction. Also in this case, total internal reflection on the inside of an outer surface of the FCAS structure 5 does occur. In particular, an optically non-imaging concentrator 55 may be used in the propagation path between an optical fiber 30 and optoelectronic and/or photonic element 50, especially for narrowing the light beam emitted by the fiber end piece 31 before entering the element 50 which may be a light receiving element such as a photo diode, for instance. Although the circumferential surface of the concentrator 55 reduces in diameter with decreasing distance from the photo diode or element 50, the direction of main propagation of the light beam is not altered, since the concentrator is rotationally symmetric and substantially straight. Light rays close to the circumferential surface of the concentrator are reflected, due to total internal reflection, towards the end surface of the concentrator contacting the photo diode or element. Since this end surface of the concentrator is smaller in diameter than the opposite end of the concentrator, the concentrator allows precise alignment of a light beam emitted by a fiber end piece 31 with respect to the active area of the photo diode or other kind of optoelectronic or photonic element 50 or 50$i$.

The fiber coupling alignment structure 5 (FCAS) may comprise one concentrator 55 or a plurality of concentrators. The concentrator or concentrators are thus formed by the polymer material 4 and are surrounded by the ambient air or atmosphere. The circumferential surface of each concentrator serves as a guiding surface for narrowing the diameter and/or cross-section of the respective light beam.

FIGS. 23 to 26 show some exemplary embodiments of fiber coupling devices which are manufactured by methods of the present application and which comprise at least one concentrator representing the reflection surface.

Whereas hereinabove concentrators are regarded as reflection surfaces, an alternative interpretation of some technicians might be to not regard a concentrator as a reflection surface since the propagation direction of the beam as a whole is not altered thereby and since there are center rays which do not need to approach the circumferential surface of the concentrator. However, in such a case, the fiber coupling device would be considered to not have a reflection surface of its fiber coupling alignment structure. This understanding would thus correspond to embodiments where no reflection surface is present or where a reflection surface is an optional feature; such embodiments are also covered by the claims.

However, according to the understanding preferred and adopted in this application, a the circumferential surface of a concentrator does represent a reflection surface, in particular a reflection surface of the kind suitable for narrowing the diameter and/or cross-section of a light beam, even though generally not changing the overall propagation direction of the radiation beam. Accordingly, this understanding is adopted in the description of the further embodiments discussed hereinbelow.

Figure 23:
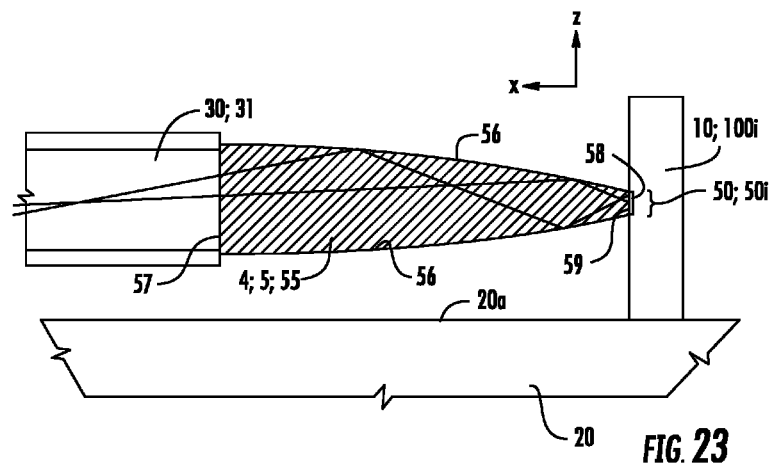
FIG. 23 shows a second embodiment of a fiber coupling device comprising at least one concentrator.

FIG. 23 shows a cross-sectional view of a concentrator 55 connected to an optoelectronic or photonic element 50 (in the case of only one element) or 50$i$ (in the case of a plurality of optoelectronic or photonic elements). Whereas the narrowed end of the concentrator 55 is in contact with the active area, that is with the surface of the optoelectronic or photonic element 50; 50$i$, the opposite, broader end of the concentrator 55 is connected to or at least faces the fiber end surface 32 of the fiber end piece 31 or fiber 30. The broader end surface of the concentrator 55 facing or even connected to the fiber end surface 32 is called the 'incident surface' 57 here since, in most applications of a concentrator, the optoelectronic element 50; 50$i$ will be a photo diode serving to receive and to detect light from the fiber end piece 32 via the concentrator. The opposite, smaller end surface of the concentrator 55 which faces and contacts the photo diode or element 50; 50$i$ is called 'emergent surface' or 'emitting surface' 58 here, since the beam of light will leave the concentrator through this surface 58 before entering the photo diode. Between the incident surface 57 and the emitting surfaces 57, the circumferential surface of the concentrator 55 forms a guiding surface 56 which, as shown in FIG. 23, is radially symmetric and can be described as a function f(x) or f(z) describing the concentrator radius depending on the position on the axial coordinate, which is x or z depending on the chosen axial orientation of the concentrator. In FIGS. 22 and 23, the concentrator extends with its axial direction along the first lateral direction x which is parallel to the substrate surface 20$a$ of the substrate 20. In these embodiments, the chip 10; 100$i$ is positioned such that its main surface and its active area surface are facing the concentrator and are contacted thereby.

The present application allows to form a concentrator or a plurality of concentrators out of the polymer material which are in perfect alignment with the optoelectronic elements 50, i.e. photo diodes, of fiber coupling devices. Accordingly, manufacturing of concentrators and mounting procedures for mounting them in proper alignment with photo diodes and optoelectronic and/or photonic chips may benefit from all methods described herein above, particularly from highly precise polymerization exploiting 3D lithography and preferably two-photon polymerization, for instance by means of 3D laser scanning. The application of these techniques and those techniques which have been discussed above and/or which are covered by the claims allow a significant increase in reproducibilty and feasibility of concentrator-to-photo-diode assemblies, since the precision which is achievable here by means of 3D lithography, 3D laser scanning and/or 2-photon polymerization allow properly aligned mounting of the emitting surfaces 58 of concentrators 55 to active area surface regions dimensioned much smaller than in conventional fiber coupling devices.

For instance, the lateral extension or diameter of the active area of an optoelectronic element (which, in the following, preferably is a photo detector or photo diode) is preferably between 20 and 50 µm, that is smaller than 50 µm. Conventional methods do not allow to reliably connect a concentrator to such small active area surfaces without significantly degrading or at least jeopardizing optical coupling efficiency, since the slightest lateral offset between the emitting surface 58 of the concentrator 55 and the active area will cut off a significant part of the light beam cross-section at the narrow end of the concentrator 55. Furthermore, in case that a gel, fluid or another adhesive is provided between the concentrator 55 and the optoelectronic element 50 and is used as an index-matching material so as to bridge an air gap in-between, conventionally at least a part of the narrowed end of the guiding surface 56 would also be contacted by the index-matching material, thereby frustrating total internal reflection there.

However, formation of the concentrator in direct contact with and perfect alignment to the active area of the optoelectronic element, by means of selective polymerization (particularly exploiting 3D lithography, 3D laser scanning and/or two-photon polymerization) as proposed here, will pave the way for manufacturing fiber coupling devices capable of connecting optical fiber end pieces 31 to photo diodes operable at data rates of the optical signals of 25 Gb/s and/or with active area lateral extensions smaller than 50 µm, for instance between 25 and 40 µm. Thereby, high-speed photo diodes capable of receiving and detecting optical signals of elevated data rates become operable on a fiber coupling device, thus leading to faster response times.

By means of the method of the application, photo detectors with active areas smaller, in diameter, than to the core of an optical fiber may be used and coupled to the fiber end piece via the concentrator without significant losses in light intensity. In particular, multi-mode optical fibers for high-speed communication links having core diameters between 50 and 80 µm may be connected to active areas being much smaller in diameter.

In FIG. 23, the dimensions of the active area and the concentrator may, for instance, be as described hereinabove. Apart from the emitting surface 58 having a diameter between 20 and 50, preferably 25 and 40 µm, the incident surface 57 may, for instance, have a diameter of between 50 and 200 µm, depending on the dimensions of the fiber end piece and the way it is connected or at least optically coupled thereto. In FIG. 23, for instance, the incident surface 57 of the concentrator 55 may be in direct contact with the fiber end surface 32 of the optical fiber end piece 31, that is with the end of the optical fiber 30.

However, a further material or structure may be provided there between such as, for instance, an index-matching material such as an adhesive, or even an air gap to be bridged by the beam of light. At the opposite end, i.e. at the small emitting surface 58, mounting of the concentrator 55 is much more critical, as discussed herein above or further below with reference to FIG. 24.

Between both axial end surfaces 57, 58, the length of the concentrator 55 may be between 0.3 and 3.0 mm, for instance between 350 µm and 450 µm. As to the incident surface 57, its diameter may be 80 µm or slightly larger, especially when a fiber having a core diameter of 80 µm and a cladding diameter of about 100 µm is used. Preferably, the diameter of the incident surface 57 of the concentrator is chosen to have a diameter larger than the diameter of the fiber core, but smaller than the diameter of the fiber including the cladding around the core. Especially multi-mode fibers with a core diameter of 80 µm or smaller and having a numerical aperture of 0.29 or smaller may be coupled, via the concentrator, to a photo diode or a photo detector. The polymer used to form the concentrator 55 (formed by the FCAS structure 5) preferably has a reflective index of between 1.6 and 1.7, for instance 1.64+/−0.01. The particular kind of polymerizable material 2 and/or the polymer material 4 are chosen correspondingly. The wavelength of operation in the fiber coupling device 1 comprising the at least one concentrator may, for instance, be about 850 nm, for instance in the range between 700 and 1000 nm. However, in general, other ranges of wavelengths may be used for optical coupling.

In FIG. 23, the particular shape of the circumferential surface of the concentrator 55 serving as the guiding surface 56 for narrowing the light beam diameter is only indicated schematically. Generally, the radius and/or diameter of the guiding surface 56 will decrease with a decreasing distance from the photo diode or element 50; 50i.

The cross-sectional shape of the guiding surface 56 shown in FIGS. 22 to 26 may be parabolic, conical, hyperbolic or something in-between, for instance, and the shape of the guiding surface 56 varies between a smaller diameter near the photo diode and a larger diameter near the fiber end piece. The guiding surface 56 is convex not only in the azimuthal direction, but also in the axial direction, that is along the axial length of the concentrator. Preferably, the curvature in the cross-sectional plane shown in FIG. 23, that is around any of the radial directions, is increasing with decreasing distance from the photo diode or photo detector.

By the methods of the present application, for instance compound parabolic concentrators of significantly reduced dimensions may be manufactured and coupled in situ, by selective polymerization, to the optoelectronic and/or photonic element. The precise manufacturing enabled by the present application thus achieves a higher coupling efficiency than obtainable by any use of lenses which are prone to aberrations, low focal depth, low tolerance of lens-to-photo diode distance, restricted numerical aperture and other disadvantageous effects. Conventionally, in case of lenses used, even deviations in the lens-to-photo-diode distance of a few micrometers result in significant defocus and thus in a loss of signal integrity. In contrast thereto, the long-imaging optical concentrator 55 concentrates, that is narrows, the electromagnetic radiation beam to a smaller area or beam diameter than a lens could do. Moreover, due to the methods exploited in the present application, the concentrator can be manufactured, from the very beginning of its fabrication, in direct contact with the active area surface of the photo diode or other kind of optoelectronic element 50, thus obviating any need for posteriori alignment between the concentrator 55 and the photo diode.

FIG. 23 further shows the optoelectronic chip 10; 100i comprising the photo diode or photo detector. The chip is mounted on the main surface 20a of the mounting substrate 20. In FIG. 23, the chip is mounted with its side surface in contact with the main surface 20a, that is substrate surface, of the mounting substrate 20. Accordingly, the chip faces the first lateral direction x. The axial direction of the concentrator 55 also corresponds to the first lateral direction x (or its opposite direction). The fiber coupling mounting structure 5 (FCAS) thus represents the concentrator 55 in this embodiment.

The FCAS 5 may further include additional structures, for instance structures for mounting the fiber end piece 31 which, by reason of mechanical stability and robustness, preferably should not be mounted exclusively, via the concentrator, to the active area surface alone. However, these additional structures need not necessarily be formed by the FCAS 5 exclusively. Instead, another, second FCAS for supporting the fiber end piece 31 in proper alignment with the optoelectronic chip 10 and/or the substrate surface 20a might be fabricated in addition.

However, at least the concentrator 55 is formed by the polymer material obtained by selective polymerization, thus constituting the FCAS 5 or at least a part or region of it. Especially the elongated polymer portion between the incident surface 57 and the emitting surface 58 is formed by means of selective polymerization (preferably by applying 3D lithography, 3D laser scanning and/or 2-photon polymerization) so as to provide proper alignment of the concentrator 55 between the fiber end piece 31 and the active area of the element 50 or photo diode, with maximum coupling efficiency ensured. Accordingly, whereas in FIG. 23 the surroundings of the concentrator 55 around its guiding surface 56 are filled with the ambient air or atmosphere, during polymer manufacture this outer volume is filled with the polymerizable material 2 which is to be selectively converted into the polymer material 4, that is polymerized, in order for the polymer to constitute the concentrator 55. Accordingly, the volume enclosed by the guiding surface 56 is the region where selective polymerization has taken place during application of the method of the present application, whereas outside the guiding surface 56, the non-polymerizable material 2 has been washed away so as to expose the polymer concentrator of light-transmissive or radiation-transmissive material. Accordingly, tiny and fragile structures such as micro-scale concentrators even 55 thinner than the fiber core of an optical fiber are producible and reliably connectable to active areas of photo diodes, photo detectors or further optoelectronic and/or photonic elements 50 having active area surfaces smaller than 50 µm in diameter. Especially with regard to the high aspect ratio of concentrators, tapering of the concentrator 55 down to half of or even a third of the core diameter (about 18 μm) of an optical fiber is rendered feasible by the methods of this application.

Figure 24:
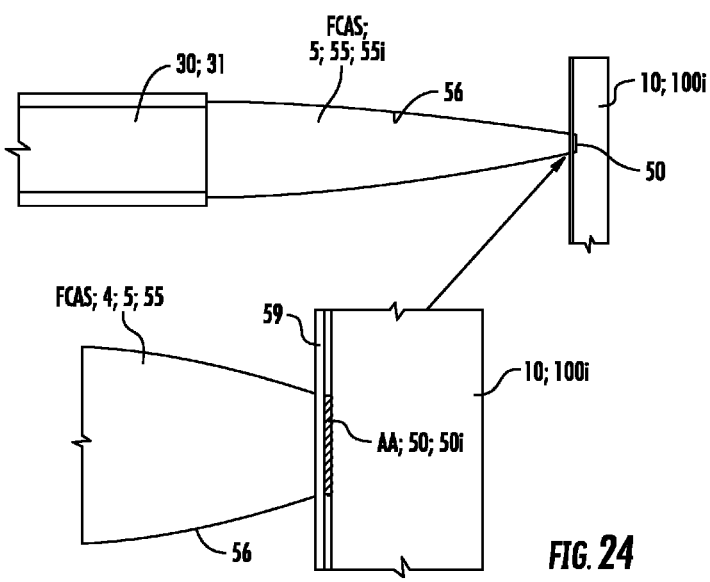
FIG. 24 shows a partial view of FIG. 23, with an expanded sectional view around the active area.

FIG. 24 shows a partial view of the mounting device of FIG. 23; in FIG. 24, the connection between the concentrator 55 and the chip 10 is shown and, partially, expanded in view. In any of FIGS. 22 to 26, instead of only one optoelectronic chip 10 being used, a plurality of chips 100$i$ may be used, in which case plural chips 100$i$ are provided and, for instance, located next to one another in the direction perpendicular to the drawing plane (second lateral direction y). Thus, instead of only one concentrator 55 shown, alternatively, a plurality of concentrators 55$i$ may be provided, though not explicitly shown. Subsequently, the specification will only refer to one single chip 10 and one single concentrator 55 for ease of explanation.

As discussed further above, proper alignment and neat mounting of the tapered end (i.e. the emitting surface 58) of the concentrator 55 to the active area of the optoelectronic element 50 (or generally 50$i$) such as the photo diode or photo detector is vital. Since any air gap would increase the likelihood of total internal reflection at the emitting surface 58 which would be fatal, it would be conceivable to provide an index-matching material by applying it before or during mounting of the concentrator on the active area surface. However, due to the small lateral cross-section of the concentrator at its surface 58, such a mounting technique would most likely cover the tapered narrow end of the guiding surface 56 with the index-matching material, thereby likewise undermining light beam concentration and frustrating total internal reflection there, i.e. in regions of the guiding surface 56 closest to the emitting surface 58.

Instead, according to the present application, the FCAS 5 or concentrator 55 is formed by selective polymerization in direct contact with the surface of the active area of the optoelectronic element (especially photo diode or photo detector). Accordingly, no index-matching material or other kind of bridging material needs to be provided. Furthermore, proper alignment is automatically obtained since the position of the active area on the main surface of the chip 10 can be monitored in situ, prior to and/or during selective polymerization on top of it. Thereby, the narrowed tip or end portion of the concentrator 55 having a diameter of between 20 and 40, for instance 25 to 30 μm, can automatically be aligned properly to the active area surface. In particular, the optical vision system described earlier with reference to FIGS. 11 and 21, for instance, may be used for visual control and alignment control. In any case, the FCAS 5 or concentrator 55 may be formed in direct contact with the outermost surface of the optoelectronic and/or photonic chip 10 or 100$i$, that is in direct contact with the outermost surface of the optoelectronic and/or photonic element 50 or 50$i$, particularly its photo diode or photo detector.

The outermost surface is the surface of the chip 10 or element 50 which is exposed to the polymerizable material 2 when executing the step of selective polymerization. No further cover layer or intermediate layer needs to be applied before selective polymerization. However, the chip 10 or optoelectronic element 50 per se may comprise a cover layer 59, as illustrated in the expanded partial view of FIG. 24, such as an index-matching layer made of an index-matching material. However, according to the present application such a cover layer 59 will not be applied at the time of executing selective polymerization or applying the polymerizable material to the surface of the substrate, chip and/or element 50. Instead, the chip 10; 100$i$, optionally including the cover layer 59 on the surface of its active area, is provided first, the cover layer thus forming part of the chip when the steps of applying the polymerizable material and selective polymerization are to be executed. Accordingly, the gel, adhesive, fluid or other kind of index-matching material may be present forming a cover layer 59. However, such an optional cover layer 59 is already formed as a constituent part of the substrate, chip and/or element 50 even before the polymerizable material 2 is put thereon and before selective polymerization is executed. Thus no handling of further fluid, gel, adhesive or further quantities of index-matching material is required; neither prior to nor during application of the polymerizable material and subsequent selective polymerization.

Accordingly, with the method of the application, there is no risk that any regions of the guiding surface 56 of the concentrator close to the photo diode may be covered by quantities of index-matching material or cover layer 59. So any risk of preventing light rays close to the output end surface 58 of the concentrator from undergoing total internal reflection at the narrowest portion of the guiding surface 56 cannot occur.

According to the application, formation of any fiber coupling alignment structure 5; FCAS having a support interface surface of polymer material being 'in direct contact with' the substrate surface and/or with the at least one optoelectronic and/or photonic element (by means of selective polymerization using 3D lithography) in the context of this application means that no additional material (such as further quantities or layers of an index matching material, for instance) needs to be provided on the outermost surface of the substrate and/or chip.

However, in case that an optional cover layer 59 has already been formed earlier on the chip surface, as explained above, and in case that it is an index-matching layer, the active area underneath may, for instance, have a refractive index of above 2.0 whereas the polymer formed by selective polymerization may have a refractive index of below 1.7, for instance of 1.64; these are refractive index values at the wavelength of operation, which may be in the visible or infrared range, for instance.

Figure 25:
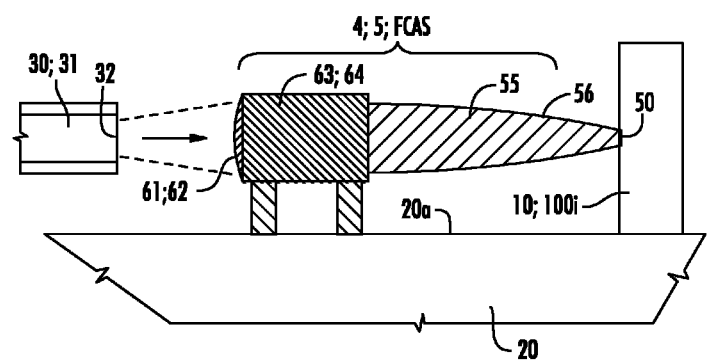
FIG. 25 shows a third embodiment of a fiber coupling device comprising at least one concentrator.

FIG. 25 shows an alternative embodiment in which the FCAS 5 does not only comprise the concentrator 55 or the plurality of concentrators 55$i$ (not illustrated in FIGS. 23 and 24) but also comprises at least one further optical element which—at least generally—is capable of producing an optical image. However, in combination with the concentrator, no optical image needs to be actually formed. Instead, the optical element such as a lens or lens surface may be provided for pre-focusing or narrowing the optical beam, i.e. beam of radiation, in a certain distance ahead of the concentrator 55. By consequence, the concentrator 55 does not need to have an incident surface 57 exposed to the ambient air or atmosphere or, alternatively, to the fiber end surface 32. Instead, an optical element such as a lens 61 or at least a lens surface 62 may be provided between the concentrator 55 and the fiber end piece 32. In particular, the lens 61 or lens surface 62 may also form part of the surface of the FCAS 5 and may thus be produced when the fiber couple alignment structure FCAS is formed by selective polymerization. Preferably, the lens and the concentrator are made of the same polymer material. According to an embodiment, they are part of one monolithic element, such as a polymer block. The lens preferably is wider in diameter or cross-section than the cable core and/or cladding of the optical fiber. Thereby, a divergent light beam exiting the cable core may be pre-focused and thereby narrowed to some extent to ensure that the whole beam of light actually enters the concentrator 55. The space between the lens 61 and the concentrator 55 may be bridged by an air gap of appropriate distance. Alternatively, as depicted in FIG. 25, this distance between the lens or lens surface 62 and the concentrator 55 may also be filled with polymer material, thus providing a widened polymer structure 64 or bridging region 63 between the lens surface 62 and the concentrator 55. Preferably, a monolithic FACS polymer block is formed whose outer surface at least comprises the guiding surface 56 of the concentrator, the lens surface 62 and further surface regions defining the widened polymer structure 64.

The FCAS thus does not necessarily need to comprise a fiber coupling surface for supporting the optical fiber. Instead, the fiber end piece may be supported by a further structure provided at a distance from the FCAS 5. However, preferably the FCAS 5 comprises at least one support interface surface at which the polymer material is in direct contact with the substrate surface 20a of the mounting substrate 20 directly. For instance, the widened polymer structure 64 may include a pedestal or a mounting region connected to the substrate surface 20a of the mounting substrate and/or to mounting structures arranged on the mounting substrate which approach the polymer region between the concentrator and the lens surface. Whatever design ensuring a robust mounting connection between the mounting substrate 20 and the polymer structure will be chosen, in any case the widened polymer structure 64 is usable as a means for stably anchoring the concentrator 55 and/or lens 62 (or lens surface 62) to the mounting substrate 20; be it directly or indirectly (i.e. via an intermediate mounting structure, such as a pedestal, pillar or other kind of support).

It goes without saying that the figures of the present application are not necessarily to scale; the dimensions and proportions may be varied depending on the respective embodiments put into practice. As an example, the concentrator 55 may have a length of 1.9 mm, the widened polymer structure 64 (serving as an intermediate bridging region 63) may have a length of 1.0 mm and the distance between the lens or lens surface 62 and the fiber end surface 32 of the optical fiber may be 0.6 mm. Accordingly, there may be an air gap of 0.6 mm, for instance. The active area may be 25 to 50 µm in diameter, whereas the concentrator 55, at its narrowed end represented by its emitting surface 58, may have a diameter of between 20 and 45 nm. The lens surface 62 may be aspheric.

Figure 26:
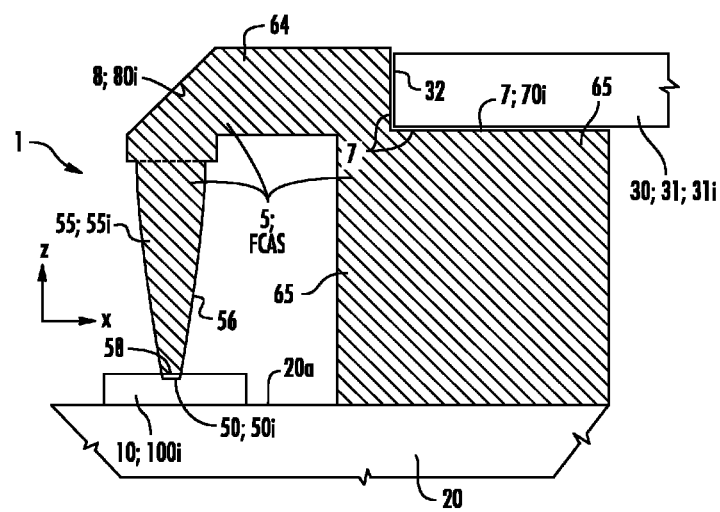
FIG. 26 shows a fourth embodiment of a fiber coupling device comprising at least one concentrator, the concentrator being oriented with its main extension normal to the substrate surface.

FIG. 26 shows an alternative embodiment of a fiber coupling device 1 comprising at least one concentrator 55. In this embodiment, the axial direction of the concentrator 55 is the vertical direction z perpendicular to the main surfaces of the mounting substrate 20 and the optoelectronic chip 10; 100i. Here, the chip 10 is oriented parallel to the mounting substrate 20. Accordingly, the light or radiation to be received by the photo detector, photo diode or other kind of optoelectronic or photonic element 50; 50i of the chip 10 propagates essentially vertically, i.e. along the normal direction z of the substrate surface 20a, when passing the concentrator 55.

Opposite to the narrow emitting surface 58 thereof, a widened polymer structure 64 is arranged which comprises a further reflection surface in addition to the concentrator 55, namely a reflection mirror 8; 80i for obtaining a 90° turn.

The optical fiber 30 with its end piece 31 extending parallel to the mounting surface 20a is mounted to it by means of a fiber support structure 65 which forms part of the FCAS 5, in addition to the concentrator 55 and the widened polymer structure 64. The fiber support structure comprises the fiber support regions 7; 70i. The widened polymer structure 64 comprises an intermediate bridging region 63 that bridges a lateral distance between the position x of the concentrator 55 and the position x of the fiber support structure 65. The concentrator 55, the fiber support structure 65 and the intermediate bridging region 63 connecting them with one another preferably form a monolithic block of polymer which has been formed by selective polymerization using 3D lithography with the various method-related embodiments cited herein above with reference with FIGS. 22 to 25. The reflection mirror oriented at about 45° reflects the radiation emerging from the fiber end surface 32 from a lateral path to a vertical path, towards the active area surface of the photo diode or photo detector 50; 50i. As in the previous figures, according to the choice of the technician, either only a single optoelectronic element 50, concentrator 55, reflection mirror 8 and fiber end pieces 31 may be mounted on the fiber coupling device 1. Alternatively, a plurality of them (50i; 55i, 80i, 70i, 31i) may be provided on the same fiber coupling device 1. In the latter case, either plural or only one single intermediate bridging region 63 may be provided for all concentrators, to form either plural or only one combined widened polymer structure 64.

The shape, position and/or orientation of the concentrators 55i and/or reflection mirrors 80i in FIGS. 22 to 26 may be optimized so as to compensate any misalignments of the optoelectronic chips, their active areas and/or of the fiber end pieces. Due to the lateral air gap bridged between the concentrator 55 and the fiber support structure 65 which are arranged at a height lower than the bridging region 63, total internal reflection of the inside of the guiding surface 56 ensured and is not sabotaged by the fiber support structure 65 extending down to the main surface 20a of the mounting substrate 20.

The fiber coupling devices of FIGS. 22 to 26 may, for instance, comprise only one concentrator or a plurality of, for instance, two or four concentrators, for instance. All further features or manufacturing details not explicitly addressed in the description of FIGS. 22 to 26 may be chosen equally or analogously as explained with reference to FIGS. 1 to 20 and 21. Insofar, these figures are referred to again.

What is claimed is:

1. A method of forming a fiber coupling device, the fiber coupling device comprising a substrate, the substrate having a substrate surface and at least one optoelectronic and/or photonic element, and further comprising at least one fiber coupling alignment structure that is optically transmissive, wherein the method at least comprises:
   a) applying a polymerizable material to the substrate surface and/or to the at least one optoelectronic and/or photonic element,
   b) selectively polymerizing, using a method of 3D lithography, a region of the polymerizable material by visually monitoring the position and/or shape of the regions to be polymerized by means of a visual system enabling real-time correction during execution of 3D lithography so as to convert the region of the polymerizable material into a polymer material, thereby forming at least one fiber coupling alignment structure which comprises at least one of:
      a support interface surface at which the polymer material is in direct contact with the substrate surface and/or with the at least one optoelectronic and/or photonic element,
      a fiber support region adapted to support at least one optical fiber in an aligned position for optical coupling to the substrate and/or to the at least one optoelectronic and/or photonic element, and/or at least one reflection surface for reflecting light propagating between at least one optical fiber and the at least one optoelectronic and/or photonic element of the substrate, and c) cleaning the substrate and the polymer material from remaining non-polymerized polymerizable material, thereby exposing the at least one fiber coupling alignment structure of the fiber coupling device.

2. The method of claim 1, wherein selective polymerizing of the region of the polymerizable material is performed using a method of contactless 3D lithography.

3. The method of claim 1, wherein selective polymerizing of the region of the polymerizable material is performed using a method of maskless 3D lithography.

4. The method of claim 1, wherein step b) of selectively polymerizing and thereby converting the region of the polymerizable material into the polymer material is executed by performing 3D laser scanning.

5. The method of claim 4, wherein performing 3D laser scanning includes focussing and/or otherwise controlling a laser beam such that two-photon-polymerisation occurs in a focal region of the laser beam exclusively, thereby restricting an area where polymerization does occur to the position and/or extension of the focal region of the focussed laser beam.

6. The method of claim 4, wherein performing 3D laser scanning comprises:

moving the substrate in two lateral directions transverse to a direction of a laser beam; and moving a focal region of the laser beam, along a third direction normal to the substrate surface of the substrate, by varying the focal distance of the laser beam.

7. The method of claim 4, wherein performing 3D laser scanning comprises:

measuring a real-time position of the optoelectronic and/or photonic element relative to a position of a focal region of a laser beam, to a position of a partially fabricated polymer structure and/or to a predefined reference position for starting polymerization on the substrate, wherein any offset of the measured real-time position from a predefined default position of the optoelectronic and/or photonic element is compensated by shifting, before and/or during selective polymerizing, the position of the laser beam, of its focal region and/or of the substrate.

8. The method of claim 1, wherein the at least one optoelectronic or photonic element is designed for emitting and/or receiving light to and/from a propagation direction inclined by less than 45° relative to a normal direction of a main surface of the substrate; and wherein the fiber coupling alignment structure is shaped such that the fiber support region is adapted to support at least one optical fiber with its axial direction inclined by more than 45° relative to the normal direction of the main surface of the substrate.

9. The method of claim 1, wherein the method further comprises:

d) mounting at least one optical fiber to the fiber support region of the at least one fiber coupling alignment structure after having performed steps a) through c).

10. The method of claim 1, wherein a fiber coupling device comprising a plurality of optoelectronic and/or photonic elements for coupling to a plurality of optical fibers is used and wherein a fiber coupling alignment structure is formed which comprises:

a plurality of fiber support regions, each fiber support region for supporting one optical fiber to be optically coupled to one of the plural optoelectronic and/or photonic elements, and a plurality of reflection surfaces, each reflection surface being adapted for reflecting light propagating between one respective optical fiber and one of the plural optoelectronic and/or photonic elements.

11. The method of claim 1, wherein the fiber coupling alignment structure is in direct contact with the plurality of optoelectronic and/or photonic elements.

12. The method of claim 1, wherein the method includes:

determining, prior to and/or during selective polymerizing of the region of the polymerizable material, positional and/or orientational misalignments of each optoelectronic and/or photonic element or each optoelectronic and/or photonic chip relative to the substrate surface or to a default position.

13. The method of claim 12, wherein determining the positional and/or orientational misalignments includes:

measuring, for each optoelectronic and/or photonic element or chip, its actual position and/or orientation or a deviation of the actual position and/or orientation from a respective default position and/or orientation relative to the substrate surface.

14. The method of claim 1, wherein the method includes calculating individually, for each respective optoelectronic and/or photonic element or chip, an individual compensational offset of at least one surface portion of the fiber coupling alignment structure.

15. The method of claim 14, wherein the individual offset includes a positional offset and/or a rotational offset of the at least one surface portion of the fiber coupling alignment structure.

16. The method of claim 14, wherein the individual offset includes a positional offset and/or a rotational offset of a respective reflection surface associated with the respective optoelectronic and/or photonic element or chip.

17. The method of claim 14, wherein the individual offset includes a positional offset and/or a rotational offset of a respective fiber support region associated with the optoelectronic and/or photonic element or chip.

18. The method of claim 14, wherein the individual offset includes at least one parameter value and/or parameter offset determining the shape of a respective reflection surface associated with the optoelectronic and/or photonic element.

19. The method of claim 18, wherein the respective parameter value or parameter offset includes a value or offset of at least one polynomial coefficient determining the shape of the respective reflection surface associated with the optoelectronic and/or photonic element.

20. The method of claim 1, wherein selective polymerizing in step b) is performed such that the fiber coupling alignment structure formed thereby comprises, for each one of the plural optoelectronic and/or photonic elements, an individually adjusted reflection surface and/or an individually adjusted fiber support region, thereby compensating misalignments of each respective optoelectronic and/or photonic elements or chip individually.

21. The method of claim 1, wherein the substrate comprises four optoelectronic and/or photonic elements and wherein one single fiber coupling alignment structure is formed on the substrate, the fiber coupling alignment structure comprising four reflection surfaces and four fiber coupling regions for coupling a plurality of four optical fibers to a plurality of four optoelectronic and/or photonic elements.

22. The method of claim 1, wherein the at least one fiber coupling alignment structure comprises:
   a support interface surface in direct contact with the substrate surface and/or with the at least one optoelectronic and/or photonic element, and
   at least one reflection surface for reflecting light propagating between at least one optical fiber and the at least one optoelectronic and/or photonic element of the substrate.

23. The method of claim 1, wherein the at least one fiber coupling alignment structure further comprises at least one fiber support region adapted to contact and/or support at least one optical fiber in an aligned position relative to the substrate.

24. The method of claim 1, wherein the at least one fiber coupling alignment structure comprises:
   a support interface surface in direct contact with the substrate surface,
   a fiber support region adapted to support at least one optical fiber in an aligned position relative to the substrate surface, and
   at least one reflection surface for reflecting light propagating between at least one optical fiber and the at least one optoelectronic and/or photonic element of the substrate.

25. The method of claim 1, wherein the at least one fiber coupling alignment structure comprises:
   a support interface surface in direct contact with the at least one optoelectronic and/or photonic element,
   a fiber support region adapted to contact and/or support at least one optical fiber in an aligned position for optical coupling to the at least one optoelectronic and/or photonic element, and
   at least one reflection surface for reflecting light propagating between at least one optical fiber and the at least one optoelectronic and/or photonic element of the substrate.

26. The method of claim 1, wherein the at least one reflection surface is designed for changing the propagation direction of a light beam by an angle of between 60° and 120°, preferably by about 90°.

27. The method of claim 1, wherein the at least one reflection surface is designed for narrowing the diameter and/or cross-section of a light beam without changing the overall propagation direction of the light beam.

28. A method of forming a fiber coupling device, the fiber coupling device comprising a substrate, the substrate having a substrate surface and a plurality of optoelectronic and/or photonic elements, and further comprising at least one fiber coupling alignment structure that is optically transmissive, wherein the method at least comprises:
   a) applying a polymerizable material to the substrate surface and/or to the plurality of optoelectronic and/or photonic elements,
   b) selectively polymerizing a region of the polymerizable material by 3D lithography by visually monitoring the position and/or shape of the regions to be polymerized by means of a visual system enabling real-time correction during execution of 3D lithography so as to convert the region of the polymerizable material into a polymer material, thereby forming at least one fiber coupling alignment structure comprising:
      a support interface surface at which the polymer material is in direct contact with the substrate surface and/or with the plurality of optoelectronic and/or photonic elements,
      a plurality of fiber support regions each adapted to support one respective optical fiber in an aligned position with respect to a respective one of the plural optoelectronic and/or photonic elements, and
   c) cleaning the substrate and the polymer material from remaining non-polymerized polymerizable material, thereby exposing the at least one fiber coupling alignment structure of the fiber coupling device.

29. The method of claim 28, wherein the at least one fiber coupling alignment structure is formed and/or shaped so as to include a plurality of concentrators for transmitting and/or focusing light propagating between optical fibers and the plurality of optoelectronic and/or photonic elements.

30. The method of claim 29, wherein the concentrators comprise reflection surfaces designed to reduce the diameter and/or cross-section of light beams approaching the optoelectronic and/or photonic elements.

31. The method of claim 29, wherein the concentrators comprise circumferential reflection surfaces whose diameter and/or lateral cross-section increases with increasing distance from the optoelectronic and/or photonic elements.

32. The method of claim 28, wherein the at least one fiber coupling alignment structure is formed and/or shaped so as to include a plurality of optical elements designed for focusing and thereby optically imaging light beams propagating between optical fibers and the plurality of optoelectronic and/or photonic elements.

33. The method of claim 28, wherein the at least one fiber coupling alignment structure is designed to redirect and/or to narrow light beams exiting fiber endpieces of optical fibers and approaching the optoelectronic and/or photonic elements.

34. The method of claim 28, wherein selective polymerizing includes overmolding.

35. A fiber coupling device, comprising:
   a substrate comprising a substrate surface and at least one optoelectronic and/or photonic element and
   at least one fiber coupling alignment structure that is arranged on the substrate surface of the substrate and that is optically transmissive,
   wherein the at least one fiber coupling alignment structure is made of a selectively polymerizable material polymerized by a 3D lithography process, the at least one fiber coupling alignment structure comprising:
   a support interface surface at which the selectively polymerizable material is in direct contact with and/or in an aligned position relative to the substrate surface and/or the at least one optoelectronic and/or photonic element,
   at least one fiber support region supporting or adapted to support at least one optical fiber in an aligned position for optical coupling to the substrate and/or with the at least one optoelectronic and/or photonic element, and/or
   at least one reflection surface for reflecting light propagating between at least one optical fiber and the at least one optoelectronic and/or photonic element, the at least one reflection surface comprising at least one of a positional offset and a rotational offset compensating for a position of the at least one optoelectronic and/or photonic element.

36. The fiber coupling device of claim 35, wherein the fiber coupling device comprises a plurality of optoelectronic and/or photonic elements and a plurality of fiber support regions.

37. The fiber coupling device of claim 35, wherein the fiber coupling device comprises a plurality of reflection surfaces for reflecting light propagating between a plurality of optical fibers and a plurality of optoelectronic and/or photonic elements, the plurality of reflection surfaces having a plurality of positional offsets and/or rotational offsets.

38. The fiber coupling device of claim 35, wherein the at least one fiber coupling alignment structure at least comprises
a plurality of support interface surfaces where the selectively polymerizable material is in direct contact with and/or in an aligned position relative to an active area surface region of a respective one of the optoelectronic and/or photonic elements, as well as
a plurality of reflection surfaces each designed for reflecting and/or concentrating a light beam leaving an endpiece of an optical fiber and approaching an active area surface region of one of the optoelectronic and/or photonic elements, wherein the plurality of reflection surfaces has a plurality of positional offsets and/or rotational offsets.

39. The fiber coupling device of claim 38, wherein each reflection surface of the plurality of reflection surface has a different positional offset and/or a different rotational offset from other reflection surfaces of the plurality of reflection surfaces.

40. The fiber coupling device of claim 35, wherein the at least one reflection surface comprises at least one of a parameter value and a parameter offset determining a shape of a respective reflection surface associated with a respective optoelectronic and/or photonic element.

41. A method of forming a fiber coupling device,
the fiber coupling device comprising a mounting substrate, the mounting substrate having a substrate surface and carrying least one optoelectronic and/or photonic chip, the fiber coupling device further comprising a fiber coupling alignment structure that is optically transmissive,
wherein the method at least comprises:
a) applying a polymerizable material to the substrate surface and to the at least one optoelectronic and/or photonic chip,
b) selectively polymerizing, using a method of 3D lithography, a region of the polymerizable material so as to convert the region of the polymerizable material into a polymer material, thereby forming a fiber coupling alignment structure comprising:
at least one first support interface surface at which the polymer material is in direct contact with the at least one optoelectronic and/or photonic chip,
at least one second support interface surface at which the polymer material is in direct contact with the substrate surface of the mounting substrate,
c) determining, prior to and/or during selective polymerizing of the region of the polymerizable material, positional and/or orientational misalignments of each optoelectronic and/or photonic element or each optoelectronic and/or photonic chip relative to the substrate surface or to a default position,
d) cleaning the substrate and the polymer material from remaining non-polymerized polymerizable material, thereby exposing the at least one fiber coupling alignment structure of the fiber coupling device.

42. The method of claim 41, wherein the fiber coupling alignment structure further comprises at least one fiber support region for supporting a respective optical fiber in an aligned position with respect to a respective one of the at least one optoelectronic and/or photonic chips.

43. The method of claim 41, wherein the fiber coupling alignment structure further comprises at least one concentrator of polymer material being arranged and/or bridging between the at least one first support interface surface and the at least one second support interface surface.

44. The method of claim 41, wherein the fiber coupling alignment structure further comprises at least one concentrator contacting at least one optoelectronic and/or photonic chip.

45. A fiber coupling device, comprising:
a mounting substrate comprising a substrate surface; at least one optoelectronic and/or photonic chip mounted to the mounting substrate and comprising an optoelectronic and/or photonic element; and
at least one optically transmissive fiber coupling alignment structure made of a selectively polymerizable material polymerized by a 3D lithography process, wherein the fiber coupling alignment structure comprises:
a first support interface surface at which the selectively polymerizable material is in direct contact with the at least one optoelectronic and/or photonic element, and at least one of
a second support interface surface, at which the selectively polymerizable material is in direct contact with the mounting substrate, and
at least one fiber support region supporting or adapted to support at least one optical fiber in an aligned position for optical coupling to the at least one optoelectronic and/or photonic chip, the at least one fiber support region comprising at least one of a positional offset and a rotational offset compensating for a position of the at least one optoelectronic and/or photonic element.

46. The fiber coupling device of claim 45, further comprising at least one reflection surface for deflecting the direction of light propagation of an optical beam by an angle of between 60° and 120°, the at least one reflection surface between disposed in an optical path extending between the at least one optoelectronic and/or photonic element and at least one optical fiber.

47. The fiber coupling device of claim 45, further comprising at least one concentrator having a narrowing guiding surface, the concentrator being disposed, in the optical path, between the at least one reflection surface and the at least one optoelectronic and/or photonic element.

48. The fiber coupling device of claim 45, wherein the at least one fiber support region comprises a plurality of fiber support regions having a plurality of positional offsets and/or rotational offsets.

49. The fiber coupling device of claim 48, wherein each fiber support region of the plurality of fiber support regions has a different positional offset and/or a different rotational offset from other fiber support regions of the plurality of fiber support regions.

50. A method of forming a fiber coupling device, the fiber coupling device comprising a mounting substrate, at least one optoelectronic and/or photonic chip and at least one optical fiber coupling alignment structure transmissive for electromagnetic radiation,
wherein the method at least comprises:

a) applying a polymerizable material to the mounting substrate and at least one optoelectronic and/or photonic chip,
b) forming, by means of 3D lithography, at least one fiber coupling alignment structure by locally polymerizing the polymerizable material selectively, thereby converting a region of the polymerizable material into a polymer material, wherein the fiber coupling alignment structure at least comprises:
  at least one concentrator, the concentrator comprising a surface of polymer material contacting an optoelectronic and/or photonic element provided on the at least one optoelectronic and/or photonic chip, and at least one of
  a support interface surface of polymer material contacting the mounting substrate, and
  a fiber support region adapted to support an optical fiber in an aligned position with respect to the at least one concentrator and/or to the at least one optoelectronic and/or photonic element, wherein the at least one concentrator is conical such that the at least one concentrator narrows with decreasing distance from the at least one optoelectronic and/or photonic chip, and
c) cleaning the substrate, the at least one optoelectronic and/or photonic chips and the polymer material from remaining non-polymerized polymerizable material, thereby exposing the at least one fiber coupling alignment structure.

51. A fiber coupling device, comprising:
a mounting substrate, at least one optoelectronic and/or photonic chip and an optically transmissive fiber coupling alignment structure directly contacting the mounting substrate and/or the at least one optoelectronic and/or photonic chip,
wherein the fiber coupling alignment structure is made of a selectively polymerizable material polymerized by a 3D lithography process, wherein the fiber coupling alignment structure comprises:
at least one concentrator, the concentrator comprising a first contact surface of the selectively polymerizable material contacting the at least one optoelectronic and/or photonic chip, wherein the at least one concentrator is conical such that the at least one concentrator narrows with decreasing distance from the at least one optoelectronic and/or photonic chip, and at least one of
a support interface surface of the selectively polymerizable material contacting the mounting substrate and
a fiber support region designed to support an optical fiber in an aligned position with respect to the at least one concentrator and/or to the at least one optoelectronic and/or photonic chip.

52. The fiber coupling device of claim 51, further comprising at least one reflection surface for deflecting the direction of an optical path, the at least one reflection surface being disposed, along the optical path, between the at least one concentrator and at least one optical fiber.

53. The fiber coupling device of claim 52, wherein the at least one reflection surface comprises at least one of a positional offset and a rotational offset compensating for a position of the at least one optoelectronic and/or photonic element.

* * * * *

UNITED STATES PATENT AND TRADEMARK OFFICE
CERTIFICATE OF CORRECTION

PATENT NO. : 10,012,806 B2
APPLICATION NO. : 15/242946
DATED : July 3, 2018
INVENTOR(S) : Michael de Jong et al.

Page 1 of 1

It is certified that error appears in the above-identified patent and that said Letters Patent is hereby corrected as shown below:

In the Claims

In Column 45, Line 39, Claim 41, delete "carrying least" and insert -- carrying at least --, therefor.

In Column 47, Line 13-14, Claim 50, after "chip," delete "and at least one of".

Signed and Sealed this
Second Day of June, 2020

Andrei Iancu
*Director of the United States Patent and Trademark Office*